US012564089B2

(12) United States Patent
Weng et al.

(10) Patent No.:  US 12,564,089 B2
(45) Date of Patent:  Feb. 24, 2026

(54) PACKAGE STRUCTURE

(71) Applicant: Taiwan Semiconductor Manufacturing Company, Ltd., Hsinchu (TW)

(72) Inventors: Chung-Ming Weng, Taichung (TW); Tzu-Sung Huang, Tainan (TW); Hao-Yi Tsai, Hsinchu (TW); Ming-Hung Tseng, Miaoli County (TW); Tsung-Hsien Chiang, Hsinchu (TW); Yen-Liang Lin, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 467 days.

(21) Appl. No.: 18/165,921

(22) Filed: Feb. 7, 2023

(65) Prior Publication Data

US 2024/0178090 A1    May 30, 2024

Related U.S. Application Data

(60) Provisional application No. 63/427,893, filed on Nov. 24, 2022.

(51) Int. Cl.
| | |
|---|---|
| *H01L 23/31* | (2006.01) |
| *H01L 21/56* | (2006.01) |
| *H01L 21/683* | (2006.01) |
| *H01L 23/48* | (2006.01) |

(52) U.S. Cl.
CPC ........ *H01L 23/3128* (2013.01); *H01L 21/565* (2013.01); *H01L 21/6835* (2013.01); *H01L 23/481* (2013.01); *H01L 2221/68327* (2013.01); *H01L 2221/68345* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Jay C Chang
(74) *Attorney, Agent, or Firm* — JCIPRNET

(57) ABSTRACT

A package structure including a semiconductor die, a redistribution layer structure and an electronic device is provided. The semiconductor die is laterally encapsulated by an insulating encapsulation. The redistribution layer structure is disposed on the semiconductor die and the insulating encapsulation. The redistribution layer structure includes a backside dielectric layer, inter-dielectric layers and redistribution conductive layers embedded in the backside dielectric layer and the inter-dielectric layers. The electronic device is disposed over the backside dielectric layer and electrically connected to an outermost redistribution conductive layer among the redistribution conductive layers, wherein the outermost redistribution conductive layer is embedded in the backside dielectric layer, and the backside dielectric layer comprises a ring-shaped recess covered by the outermost redistribution conductive layer.

20 Claims, 24 Drawing Sheets

(56)                    References Cited

U.S. PATENT DOCUMENTS

| | | | | |
|---|---|---|---|---|
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2016/0276237 | A1* | 9/2016 | Lin | H01L 24/97 |
| 2020/0294915 | A1* | 9/2020 | Chu | H01L 24/20 |
| 2021/0225773 | A1* | 7/2021 | Bae | H01L 23/3128 |

* cited by examiner

PACKAGE STRUCTURE

CROSS REFERENCE TO RELATED APPLICATION

This application claims the priority benefit of U.S. provisional application Ser. No. 63/427,893, filed on Nov. 24, 2022. The entirety of the above-mentioned patent application is hereby incorporated by reference herein and made a part of specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, integrated fan-out packages and package-on-package (POP) structures having the integrated fan-out package are becoming increasingly popular for their compactness, and the reliability of the integrated fan-out packages is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
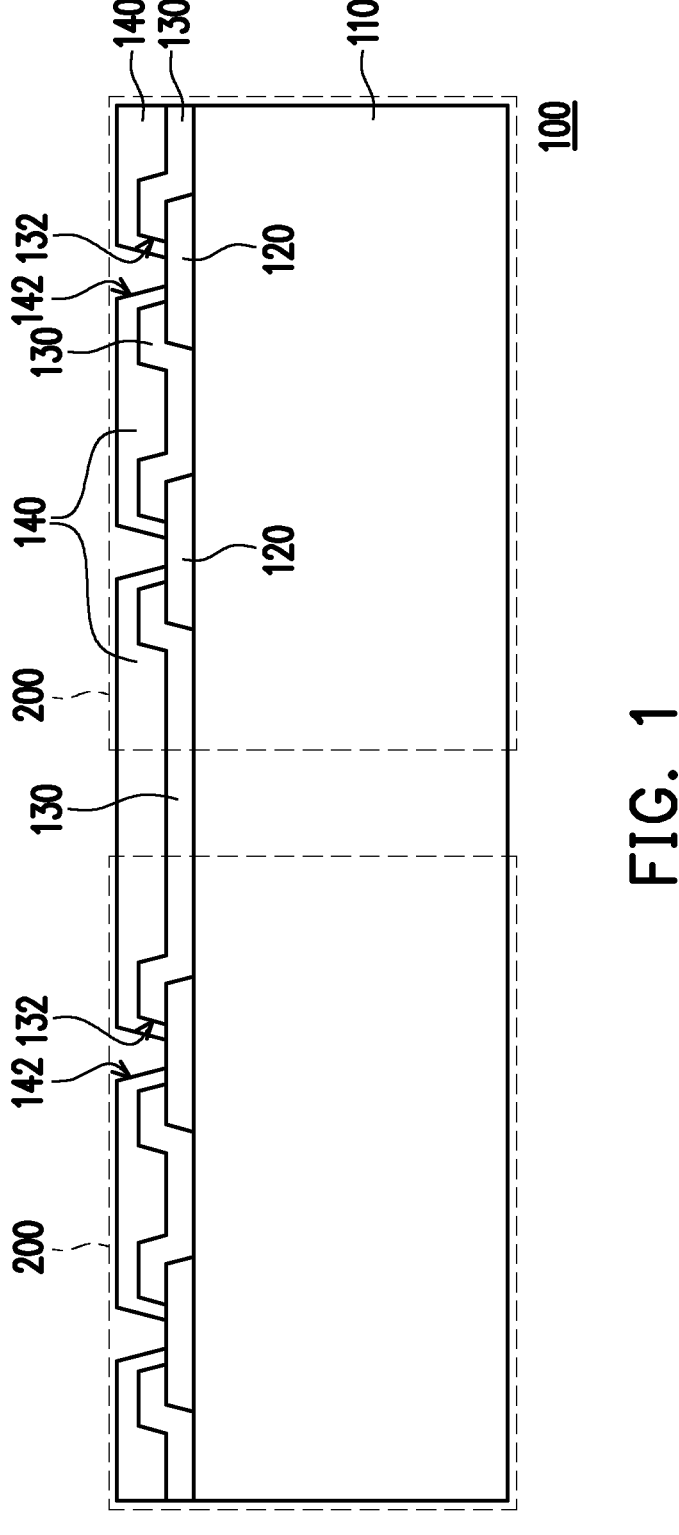
FIGS. 1 through 13 schematically illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 13 schematically illustrate a process flow for fabricating an integrated fan-out package in accordance with some embodiments. FIG. 14 is a cross-sectional view schematically illustrating a package-on-package (POP) structure in accordance with some embodiments.

Referring to FIG. 1, a semiconductor wafer 100 including a plurality of semiconductor dies 200 arranged in array is provided. Before a wafer dicing process is performed on the semiconductor wafer 100, the semiconductor dies 200 in the semiconductor wafer 100 are connected one another. In some embodiments, the semiconductor wafer 100 includes a semiconductor substrate 110, a plurality of conductive pads 120 formed on the semiconductor substrate 110, and a passivation layer 130. The passivation layer 130 is formed over the semiconductor substrate 110 and includes a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors, or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the semiconductor wafer 100 may optionally include a post-passivation layer 140 formed over the passivation layer 130. The post-passivation layer 140 covers the passivation layer 130 and includes a plurality of contact openings 142. The conductive pads 120 exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer formed by other suitable polymers.

Figure 2:
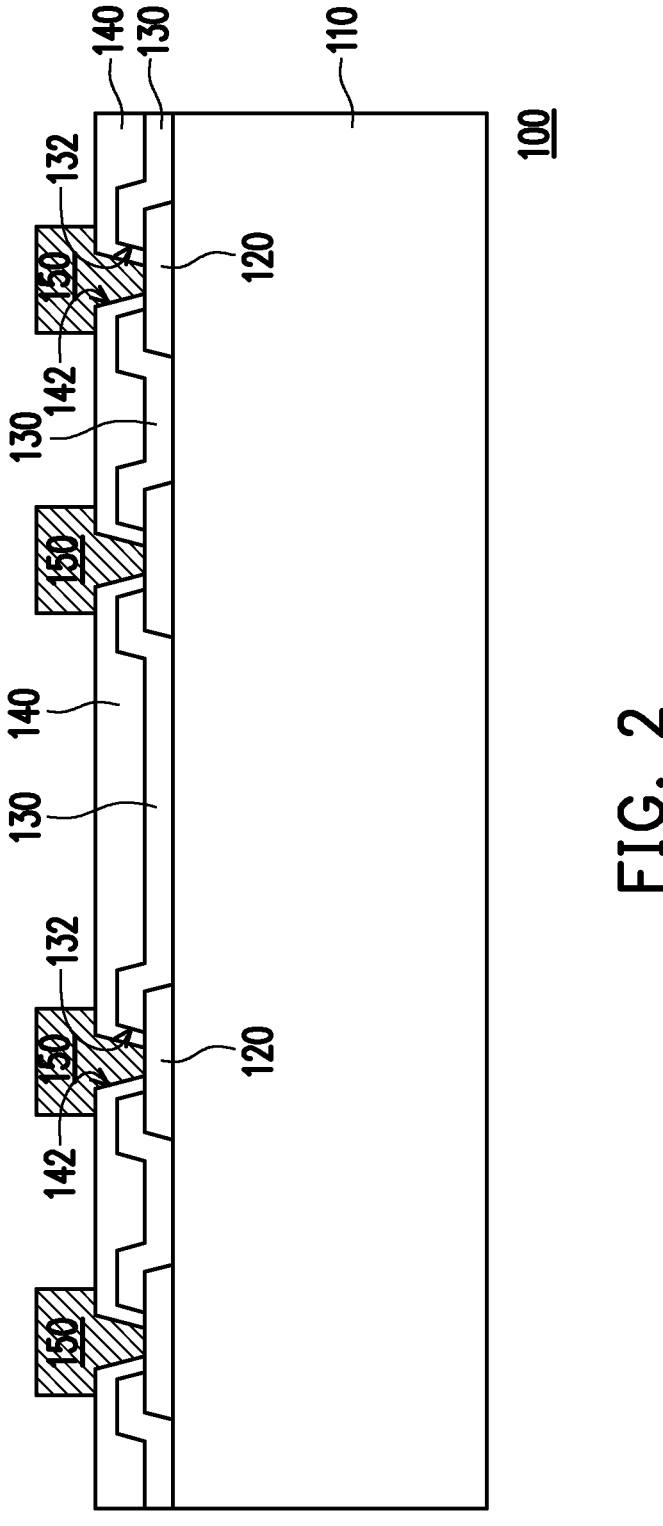

Referring to FIG. 2, a plurality of conductive pillars 150 are formed on the conductive pads 120. In some embodiments, the conductive pillars 150 are plated on the conductive pads 120. The plating process of conductive pillars 150 is described in detail as followings. First, a seed layer is sputtered onto the post-passivation layer 140 and the conductive pads 120 exposed by the contact openings 142. A patterned photoresist layer (not shown) is then formed over the seed layer by photolithography, wherein the patterned photoresist layer exposes portions of the seed layer that are located above the conductive pads 120. The semiconductor wafer 100 including the patterned photoresist layer formed thereon is then immersed into a plating solution of a plating bath such that the conductive pillars 150 are plated on the exposed portions of the seed layer that are located above the conductive pads 120. After the plated conductive pillars 150 are formed, the patterned photoresist layer is stripped. Thereafter, by using the conductive pillars 150 as a hard mask, portions of the seed layer that are not covered by the conductive pillars 150 are removed through etching until the post passivation layer 140 is exposed, for example. In some embodiments, the conductive pillars 150 are plated copper pillars.

Figure 3:
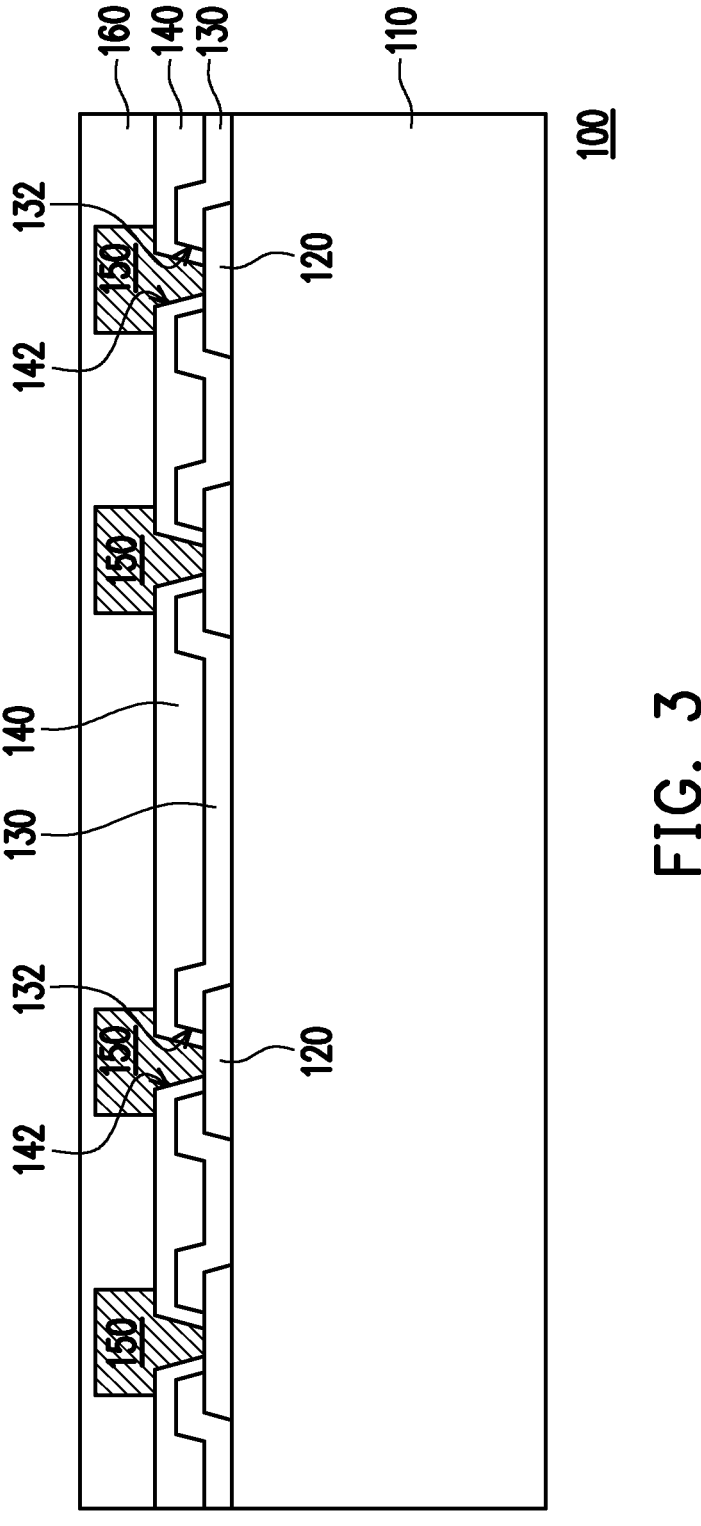

Referring to FIG. 3, after the conductive pillars 150 are formed, a protection layer 160 is formed on the post passivation layer 140 to cover the conductive pillars 150. In some embodiments, the protection layer 160 is a polymer layer having sufficient thickness to encapsulate and protect the conductive pillars 150. In other words, the maximum thickness of the protection layer 160 is greater than the height of the conductive pillars 150. The protection layer 160 may be a polybenzoxazole (PBO) layer, a polyimide (PI) layer or other suitable polymer layer. In some alternative embodiments, the protection layer 160 are made of inorganic materials.

Figure 4:
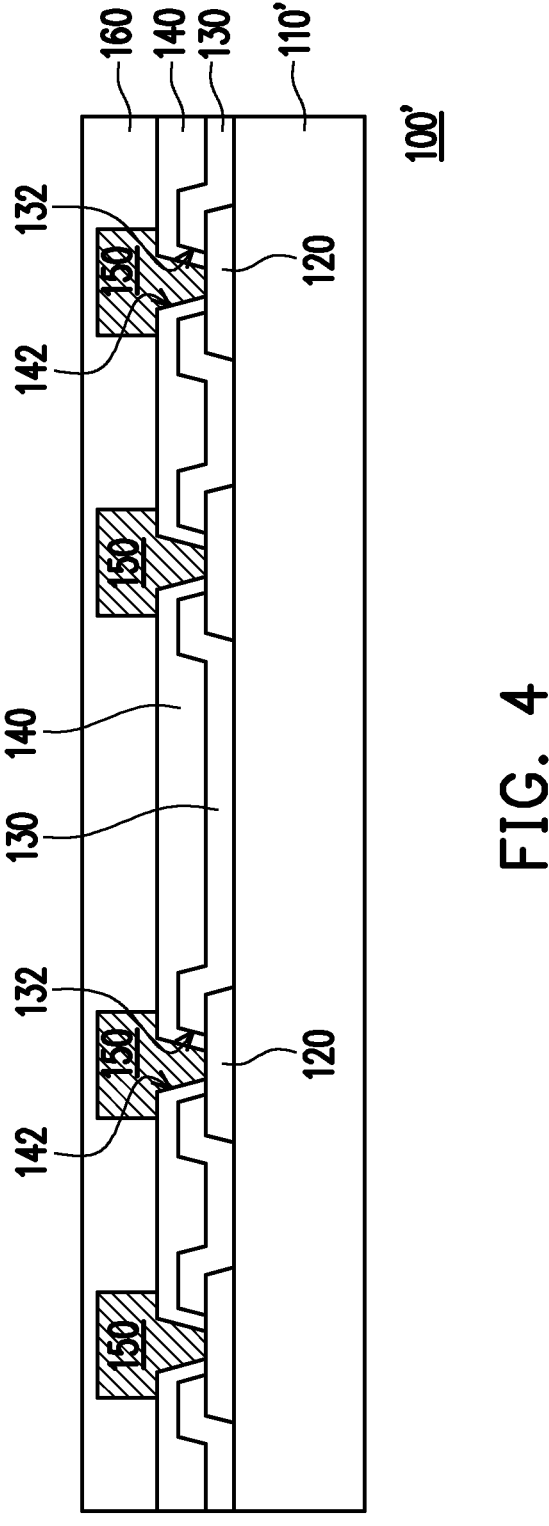

Referring to FIG. 4, a back side grinding process is performed on the rear surface of the semiconductor wafer 100 after the protection layer 160 is formed. During the back side grinding process, the semiconductor substrate 110 is partially removed such that a thinned wafer 100' including a thinned semiconductor substrate 110' is formed. In some embodiments, the back side grinding process of the semiconductor wafer 100 includes a chemical mechanical polishing (CMP) process, a mechanical grinding process or combinations thereof.

Figure 5:
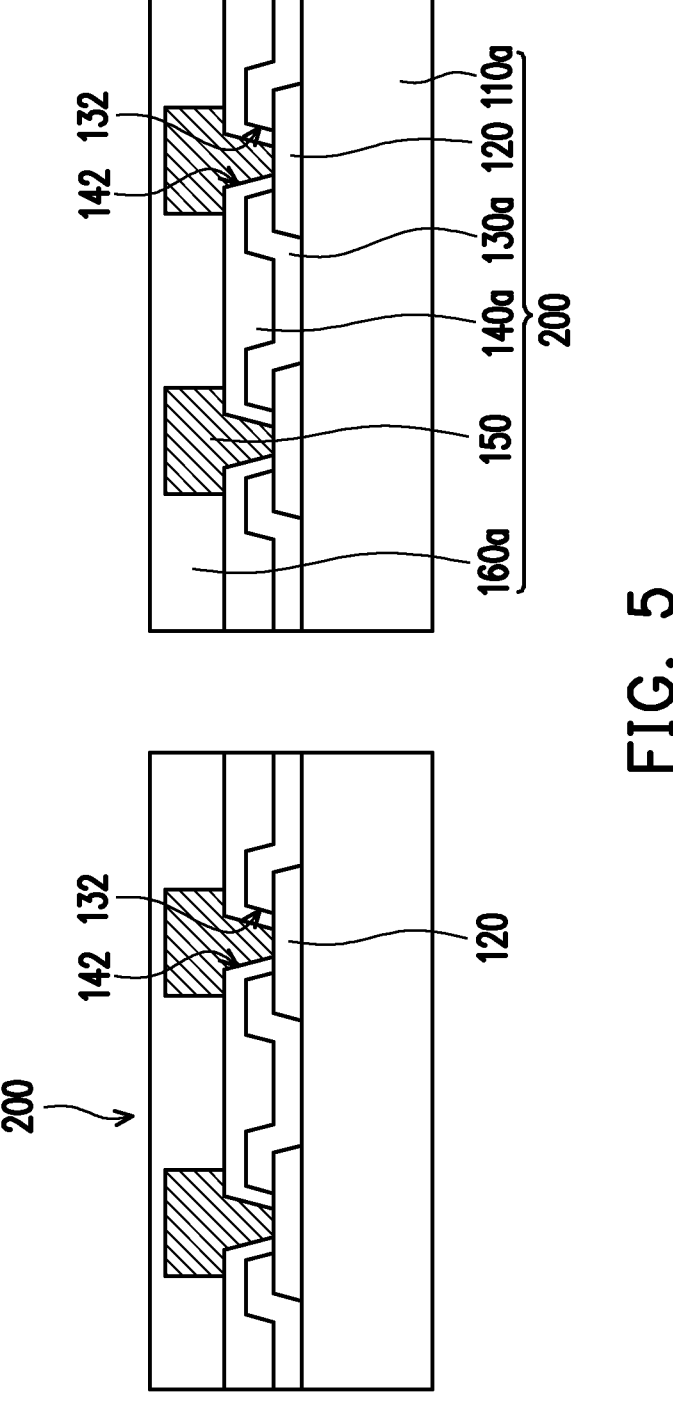

Referring to FIG. 5, after the back side grinding process is performed, a wafer dicing process is performed on the thinned wafer 100' such that the semiconductor dies 200 in the semiconductor wafer 100' are singulated from one another and a plurality of singulated semiconductor dies 200 are obtained. Each of the singulated semiconductor dies 200 may include a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the material and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 4, during the back side grinding, the protection layer 160 may protect the conductive pillars 150 of the semiconductor dies 200 from damage by the back side grinding. As shown in FIG. 5, during the wafer dicing processes, the protection layer 160a may protect the conductive pillars 150 of the semiconductor dies 200 from damage by the wafer dicing processes. In addition, the conductive pillars 150 of the semiconductor dies 200 may be protected by the protection layer 160a from being damaged by sequentially performed processes, such as the pick-up and placing process of the semiconductor dies 200, the molding process, and so on.

Figure 6:
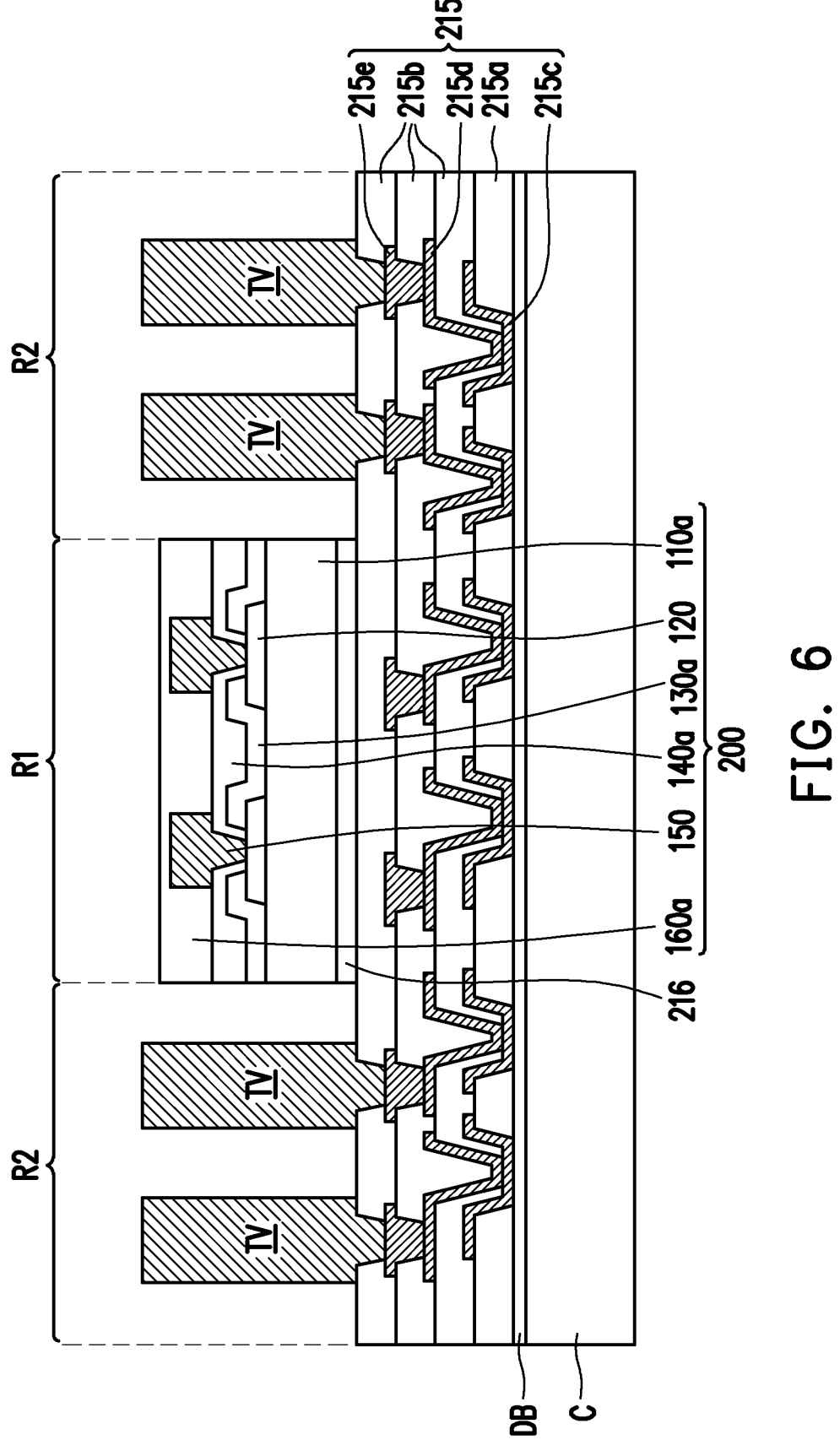

Referring to FIG. 6, after the semiconductor dies 200 are singulated from the thinned wafer 100' (shown in FIG. 4), a carrier C having a de-bonding layer DB and a back-side redistribution layer structure 215 formed thereon is provided, wherein the de-bonding layer DB is disposed between the carrier C and the back-side redistribution layer structure 215. In some embodiments, the carrier C is a glass substrate, and the de-bonding layer DB is a light-to-heat conversion (LTHC) release layer formed on the glass substrate. The above-mentioned de-bonding layer DB (i.e., the LTHC release layer) is an adhesive layer whose adhesion decreases while being heated. The back-side redistribution layer structure 215 formed over the de-bonding layer DB may include a backside dielectric layer 215a, a plurality of inter-dielectric layers 215b and a redistribution conductive layer 215c embedded in the backside dielectric layer 215a, and a plurality of redistribution conductive layers 215d, 215e embedded in the inter-dielectric layers 215b. The backside dielectric layer 215a is formed on the de-bonding layer DB. The backside dielectric layer 215a includes openings formed therein. The openings formed in the backside dielectric layer 215a may be formed through a photolithography process followed by an etch process. The backside dielectric layer 215a may be a polyimide layer formed by a spin-coating process followed by a curing process. The backside dielectric layer 215a may have a thickness ranging from about 11 micrometers to about 30 micrometers. The thickness of the backside dielectric layer 215a may be greater than or substantially equal to the thickness of the respective inter-dielectric layers 215b. The bottommost inter-dielectric layer among the inter-dielectric layers 215b is deposited on the backside dielectric layer 215a. The backside dielectric layer 215a is in contact with the de-bonding layer DB. The redistribution conductive layer 215c is in contact with the de-bonding layer DB through the openings formed in the backside dielectric layer 215a. The number of the redistribution conductive layers 215c, 215d and 215e is not limited in the present invention.

In some embodiments, the backside dielectric layer 215a and the inter-dielectric layers 215b are polybenzoxazole (PBO)-based material layers or polyimide (PI)-based material layers. In some other embodiments, the backside dielectric layer 215a and the inter-dielectric layers 215b are formed by different dielectric materials. For example, the backside dielectric layer 215a is a polybenzoxazole (PBO)-based material layers or a polyimide (PI)-based material layers, and the material of the inter-dielectric layers 215b is different from the material of the backside dielectric layer 215a.

The back-side redistribution layer structure 215 may include a die-bond region R1 and a periphery region R2, wherein the die-bond region R1 may be surrounded by the periphery region R2, and the redistribution conductive layers 215c are distributed in the die-bond region R1 and the periphery region R2. In some embodiments, the inter-dielectric layers 215b include polybenzoxazole (PBO) layers, polyimide (PI) layers or other suitable polymer layers, and the redistribution conductive layers 215c, 215d, 215e include copper wiring layers or other suitable metallic layers.

The back-side redistribution layer structure 215 may further include thermal enhancement structures (not shown in figures) embedded in the inter-dielectric layers 215*b*. The thermal enhancement structures are distributed in the die-bond region R1, for example. In some embodiments, the thermal enhancement structures are electrically insulated from the redistribution conductive layers 215*c*, 215*d*, 215*e*. For example, the thermal enhancement structures are electrically floated.

After the carrier C including the de-bonding layer DB and the back-side redistribution layer structure 215 formed thereon is provided, a plurality of conductive through vias TV may be formed on the periphery region R2 of the back-side redistribution layer structure 215. The conductive through vias TV are formed to electrically connected to the redistribution conductive layers 215*e* of the back-side redistribution layer structure 215. In some embodiments, the plurality of conductive through vias TV are formed by sputtering a seed layer, photoresist coating, photolithography, plating, photoresist stripping process, and seed layer patterning. The conductive through vias TV may be or include copper posts or other suitable metal posts. The details regarding the fabrication of the back-side redistribution layer structure 215 are described in accompany with FIG. 15A through FIG. 15D, FIG. 16A through FIG. 16F, FIG. 17A through FIG. 17E as well as FIG. 18A through FIG. 18D.

As shown in FIG. 6, in some embodiments, one of the semiconductor dies 200 (shown in FIG. 5) including the conductive pads 120, the conductive pillars 150, and a protection layer 160*a* formed thereon is picked and placed on the die-bond region R1 of the back-side redistribution layer structure 215. The semiconductor die 200 is attached or adhered with the die-bond region R1 of the back-side redistribution layer structure 215 through a die attachment film (DAF) 216, an adhesive or the like. In some alternative embodiments, a plurality of semiconductor dies 200 are picked-up and placed onto the die-bond region R1 of the back-side redistribution layer structure 215, wherein the semiconductor dies 200 placed on the die-bond region R1 of the back-side redistribution layer structure 215 are arranged in array. In an embodiment where the semiconductor dies 200 placed on the die-bond region R1 of the back-side redistribution layer structure 215 are arranged in array, the conductive through vias TV are classified into multiple groups. The number of the groups of the conductive through vias TV is corresponding to the number of the semiconductor dies 200.

As shown in FIG. 6, the top surface of the protection layer 160*a* is lower than the top surfaces of the conductive through vias TV, and the top surface of the protection layer 160*a* is higher than the top surfaces of the conductive pillars 150. However, the disclosure is not limited thereto. In some alternative embodiments, the top surface of the protection layer 160*a* is substantially aligned with the top surfaces of the conductive through vias TV, and the top surface of the protection layer 160*a* is higher than the top surfaces of the conductive pillars 150.

As shown in FIG. 6, the semiconductor die 200 is picked and placed on the back-side redistribution layer structure 215 after the formation of the conductive through vias TV. However, the disclosure is not limited thereto. In some other embodiments, the semiconductor die 200 is picked and placed on the back-side redistribution layer structure 215 before the formation of the conductive through vias TV.

Figure 7:
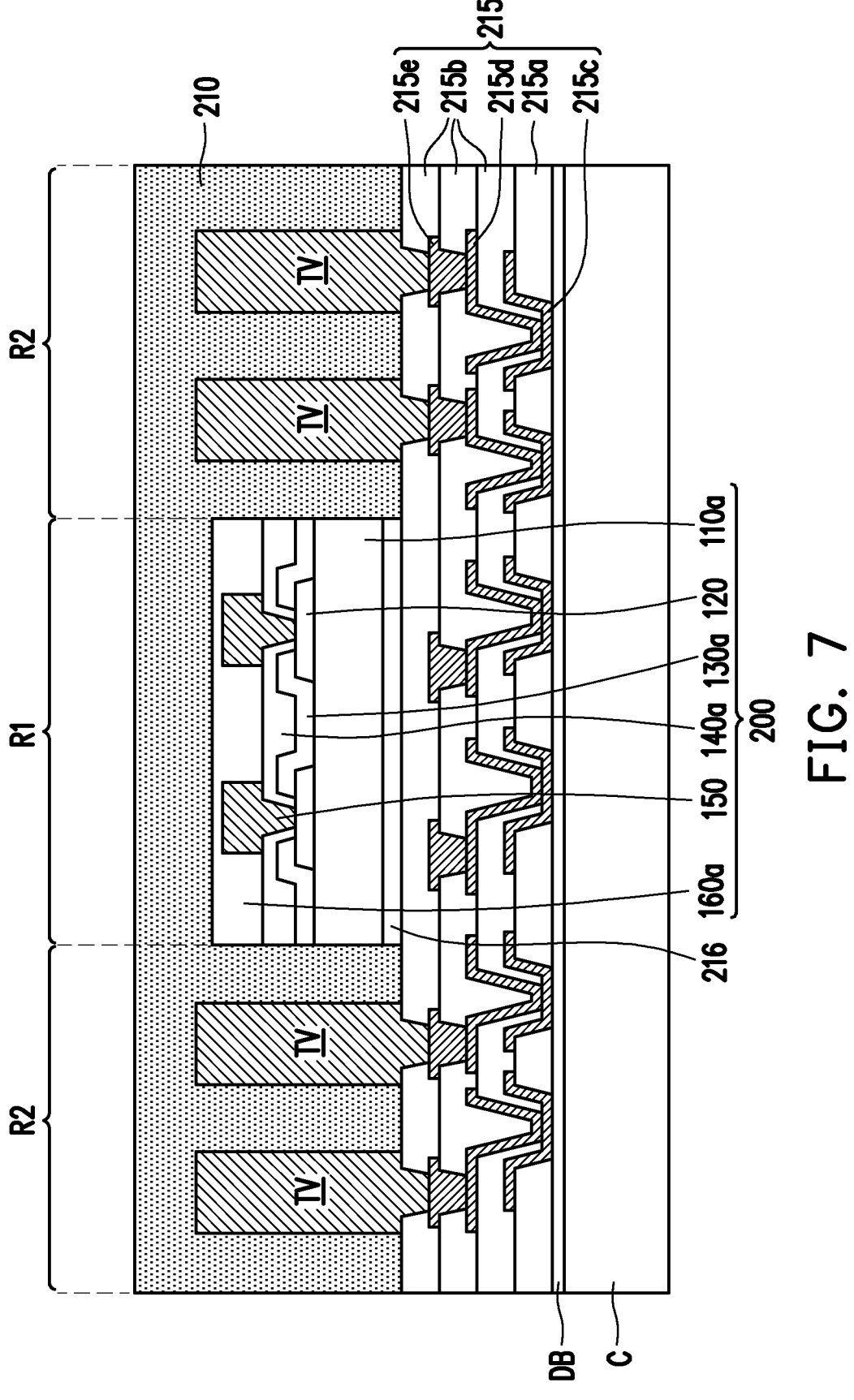

Referring to FIG. 7, an insulating material 210 is formed on the back-side redistribution layer structure 215 to cover the semiconductor die 200 and the conductive through vias TV. In some embodiments, the insulating material 210 is a molding compound formed by an over-mold process. The conductive pillars 150 and the protection layer 160*a* of the semiconductor die 200 are covered by the insulating material 210. In other words, the top surface of the insulating material 210 is higher than the top surfaces of the conductive pillars 150 and the protection layer 160*a* of the semiconductor die 200, such that the conductive pillars 150 and the protection layer 160*a* of the semiconductor die 200 are not revealed and are well protected by the insulating material 210. In some embodiments, the insulating material 210 includes epoxy or other suitable dielectric materials.

Figure 8:
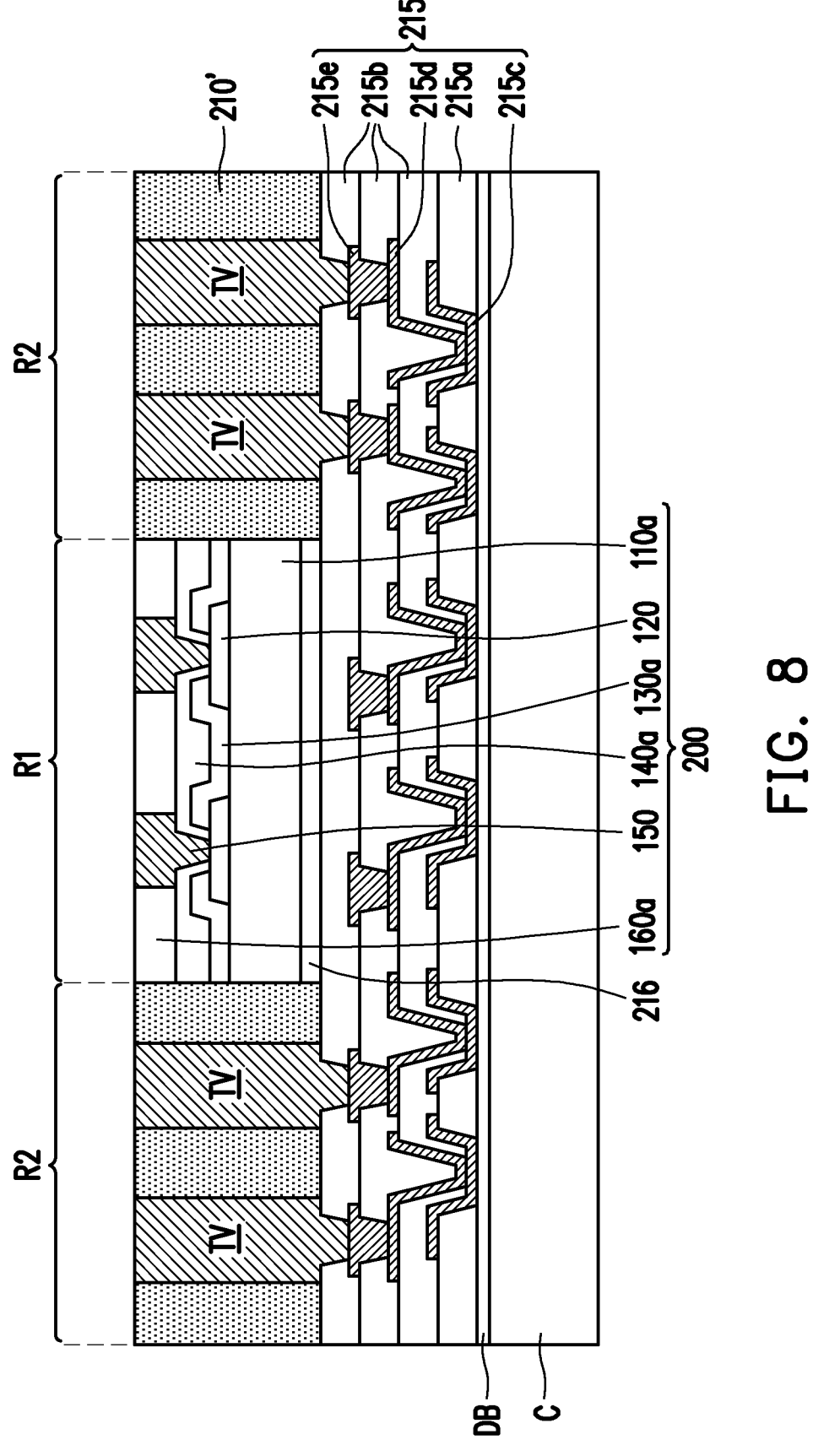

Referring to FIG. 8, the insulating material 210 is then partially removed until the top surfaces of the conductive pillars 150, the top surfaces of the conductive through vias TV, and the top surface of the protection layer 160*a* are exposed. In some embodiments, the insulating material 210 is partially removed by an etch process, a mechanical grinding process, a chemical mechanical polishing (CMP) process, or combinations thereof. After the insulating material 210 is partially removed, an insulating encapsulation 210' is formed over the back-side redistribution layer structure 215. The insulating encapsulation 210' laterally encapsulate the semiconductor die 200 and the conductive through vias TV. The semiconductor die 200 is laterally spaced apart from the conductive through vias TV by the insulating encapsulation 210'. During the removal process of the insulating material 210 (shown in FIG. 7), portions of the protection layer 160*a* are removed to form a protection layer 160*a*'. In some embodiments, during the removal process of the insulating material 210 and the protection layer 160*a* (shown in FIG. 7), portions of the conductive through vias TV and portions of the conductive pillars 150 are removed as well.

As shown in FIG. 8, the insulating encapsulation 210' encapsulates and is in contact with the sidewalls of the semiconductor die 200, and the insulating encapsulation 210' is penetrated by the conductive through vias TV. In other words, the semiconductor die 200 and the conductive through vias TV are embedded in the insulating encapsulation 210'. It is noted that the top surfaces of the conductive through vias TV, the top surface of the insulating encapsulation 210', and the top surfaces of the conductive pillars 150 may substantially level with the top surface of the protection layer 160*a*'.

Figure 9:
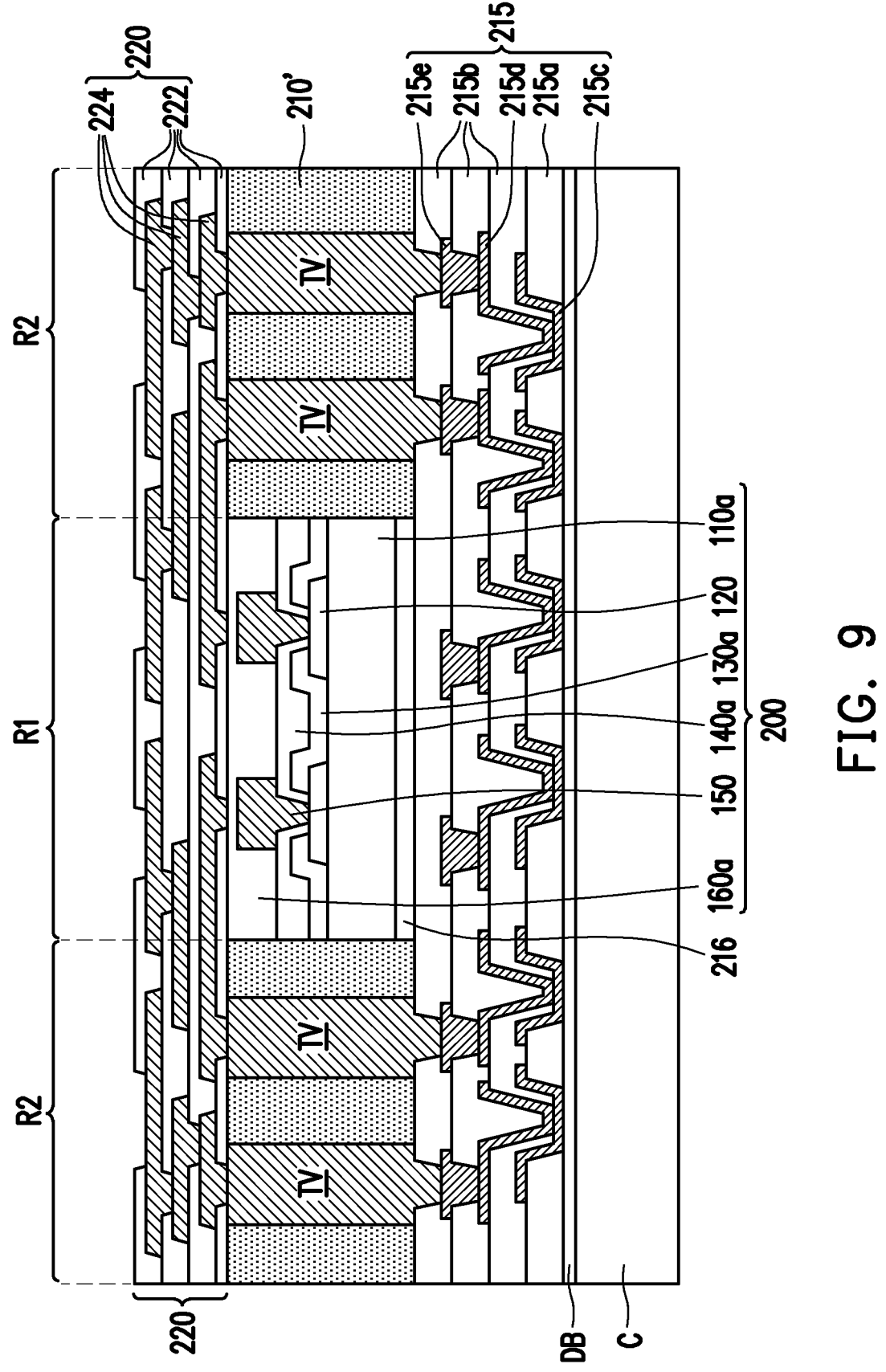

Referring to FIG. 9, after the insulating encapsulation 210' and the protection layer 160*a*' are formed, a front-side redistribution layer structure 220 electrically connected to the conductive pillars 150 of the semiconductor die 200 may be formed on the top surfaces of the conductive through vias TV, the top surface of the insulating encapsulation 210', the top surfaces of the conductive pillars 150, and the top surface of the protection layer 160*a*'. The front-side redistribution layer structure 220 is fabricated to electrically connect with one or more connectors underneath. Here, the afore-said connectors may be the conductive pillars 150 of the semiconductor die 200 and/or the conductive through vias TV embedded in the insulating encapsulation 210'. The front-side redistribution layer structure 220 is described in accompany with FIG. 9 in detail.

Referring to FIG. 9, the front-side redistribution layer structure 220 includes a plurality of inter-dielectric layers 222 and a plurality of redistribution conductive layers 224 stacked alternately, and the redistribution conductive layers 224 are electrically connected to the conductive pillars 150 of the semiconductor die 200 and the conductive through vias TV embedded in the insulating encapsulation 210'. In some embodiments, the top surfaces of the conductive pillars 150 and the top surfaces of the conductive through vias TV are in contact with the front-side redistribution layer structure 220. The top surfaces of the conductive pillars 150 and the top surfaces of the conductive through vias TV are partially covered by the bottommost inter-dielectric layer 222 among the inter-dielectric layers 222. The conductive pillars 150 and the conductive through vias TV are electrically connected to the bottommost redistribution conductive layer 224 among the redistribution conductive layers 224 through contact openings defined in the bottommost inter-dielectric layer 222. Furthermore, the topmost redistribution conductive layer 224 among the redistribution conductive layers 224 may include a plurality of conductive patterns (e.g., conductive pads) revealed by openings defined in the topmost inter-dielectric layer 222 among the inter-dielectric layers 222. In some embodiments, the inter-dielectric layers 222 includes polybenzoxazole (PBO) layers, polyimide (PI) layers or other suitable polymer layers, and the redistribution conductive layers 224 includes copper wiring layers or other suitable metallic layers.

Figure 10:
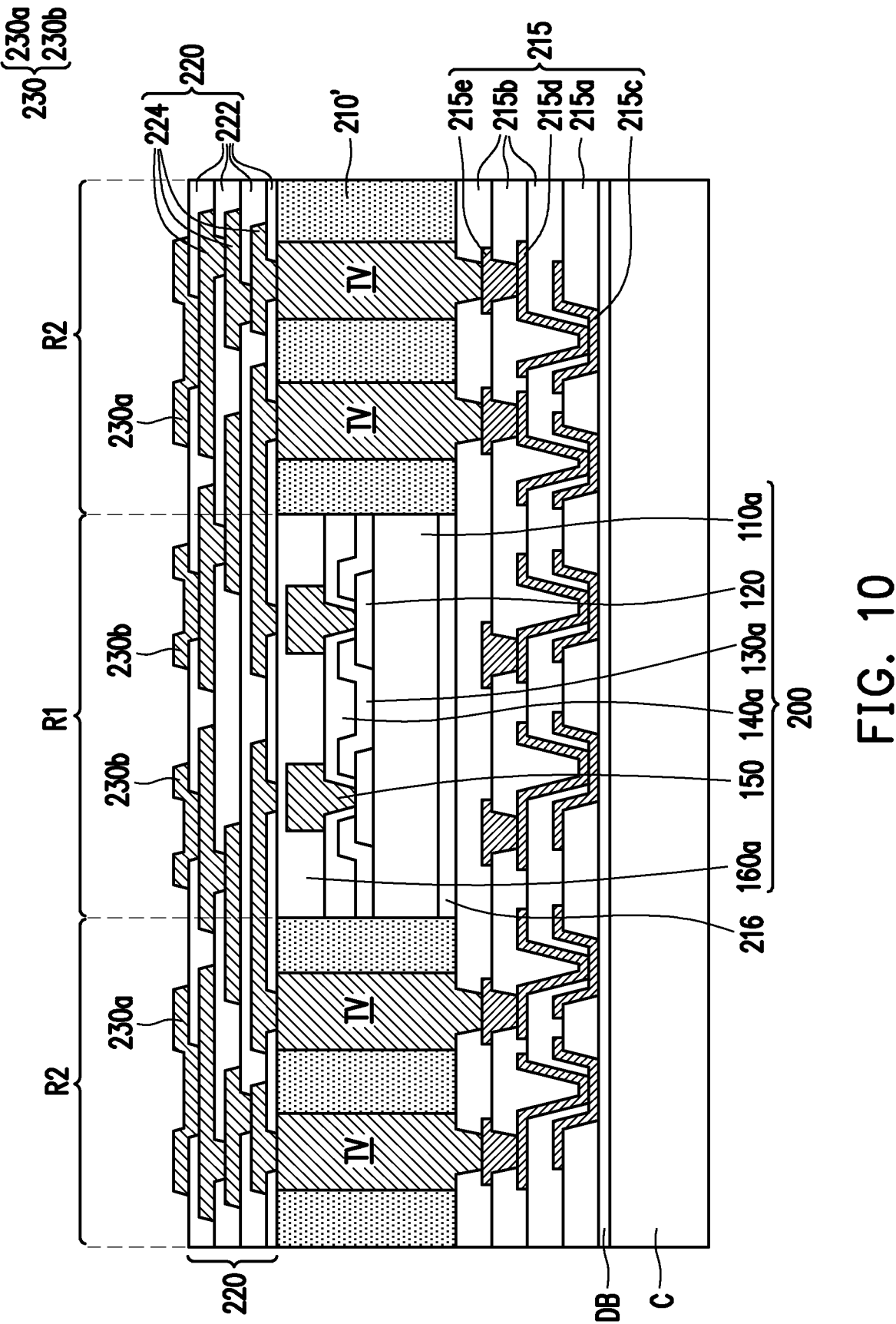

As shown in FIG. 10, after the front-side redistribution layer structure 220 is formed, a plurality of conductive pads 230 are then formed on the topmost redistribution conductive layer 224 of the front-side redistribution layer structure 220. The conductive pads 230 may be or include a plurality of under-ball metallurgy (UBM) patterns 230a for mounting of conductive terminals and a plurality of connection pads 230b for mounting of passive components. The conductive pads 230 are electrically connected to the topmost redistribution conductive layer 224 in the front-side redistribution layer structure 220. In other words, the conductive pads 230 are electrically connected to the conductive pillars 150 of the semiconductor die 200 and the conductive through vias TV through the front-side redistribution layer structure 220. It is noted that the number of the UBM patterns 230a and the number of the connection pads 230b are not limited in this disclosure.

Figure 11:
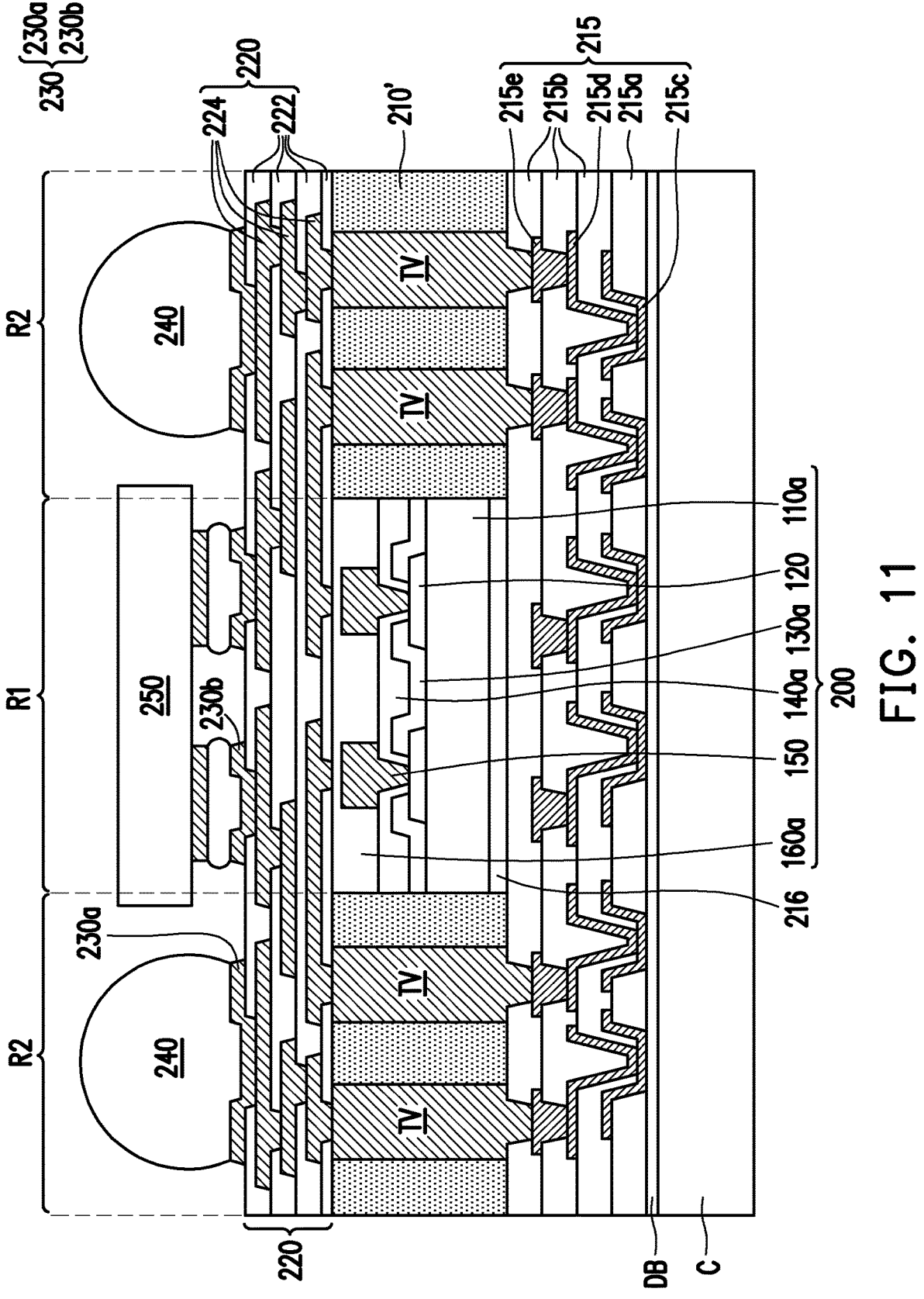

Referring to FIG. 11, after the UBM patterns 230a and the connection pads 230b are formed, a plurality of conductive terminals 240 and at least one passive component 250 are provided. The conductive terminals 240 are placed over the under-ball metallurgy patterns 230a, and the passive component 250 are mounted over the connection pads 230b. The conductive terminals 240 may be or include conductive balls (e.g., solder balls). In some embodiments, the conductive terminals 240 may be placed on the under-ball metallurgy patterns 230a through a ball placement process. The passive component 250 may be mounted on and electrically connected to the connection pads 230b through a reflow process. In some embodiments, the height of the conductive terminals 240 is greater than the height of the passive component 250.

Figure 12:
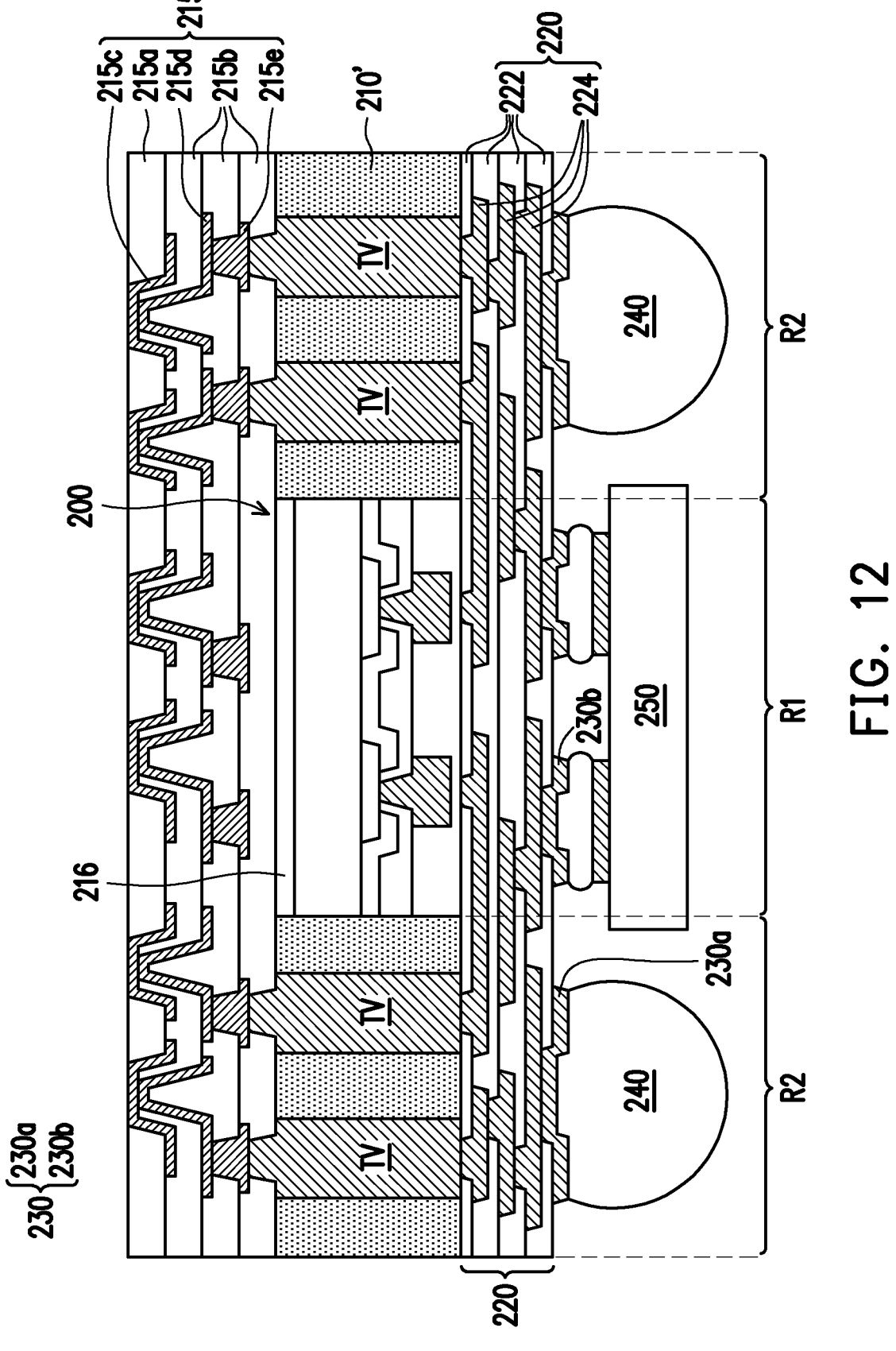

Referring to FIG. 11 and FIG. 12, after the conductive terminals 240 are mounted on the pads 230a and the passive component 250 are mounted on the pads 230b, the back-side redistribution layer structure 215 formed on the bottom surface of the insulating encapsulation 210' is de-bonded from the de-bonding layer DB such that the backside dielectric layer 215a and the redistribution conductive layer 215c of the back-side redistribution layer structure 215 are separated from the carrier C. The backside dielectric layer 215a and the redistribution conductive layer 215c are revealed after performing the de-bonding process of the de-bonding layer DB and the carrier C. In some embodiments, the de-bonding layer DB (e.g., the LTHC release layer) may be irradiated by an UV laser such that the backside dielectric layer 215a and the redistribution conductive layer 215c of the back-side redistribution layer structure 215 is de-bonded from the de-bonding layer DB and the carrier C.

Figure 13:
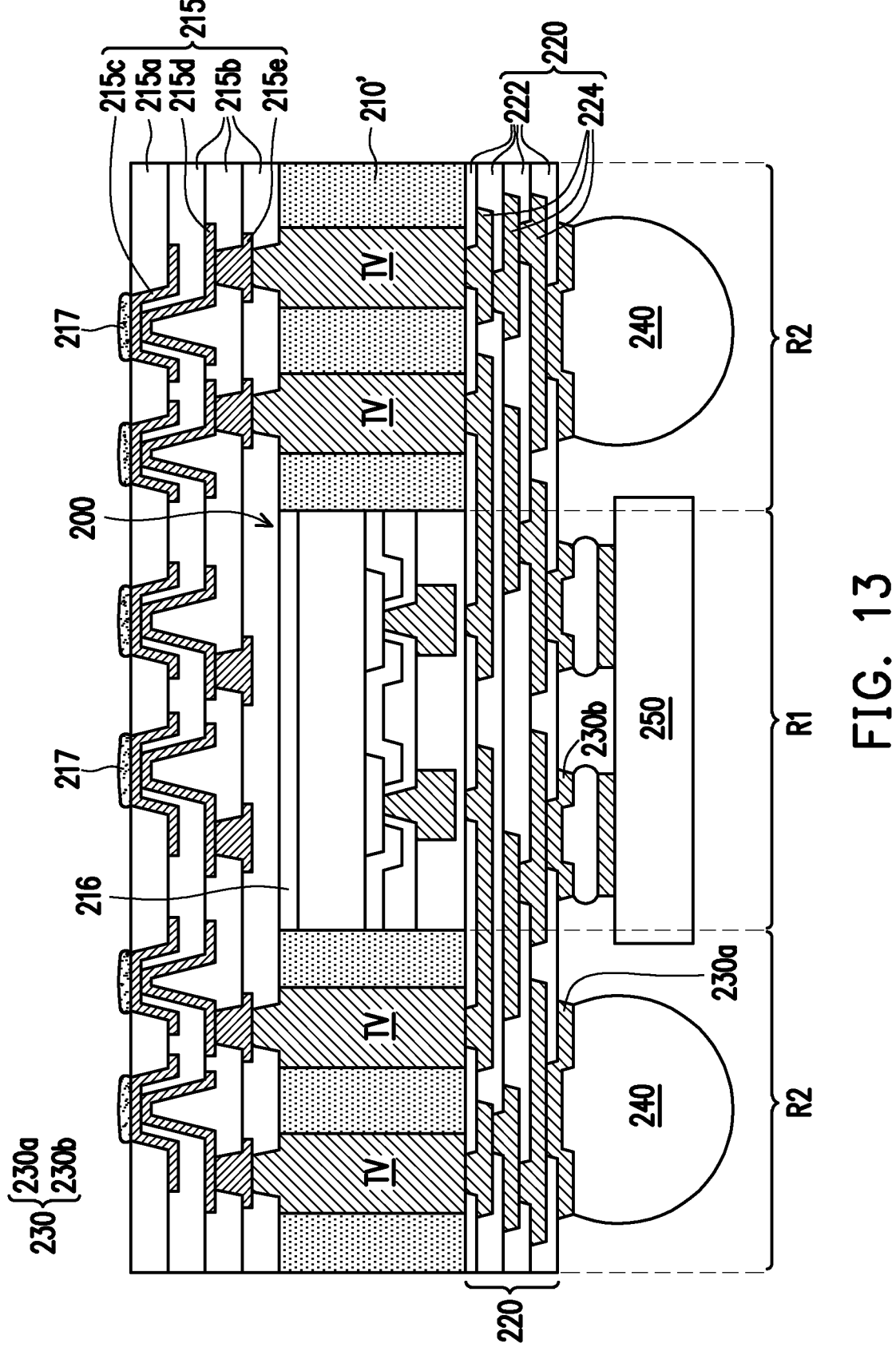
Figure 14:
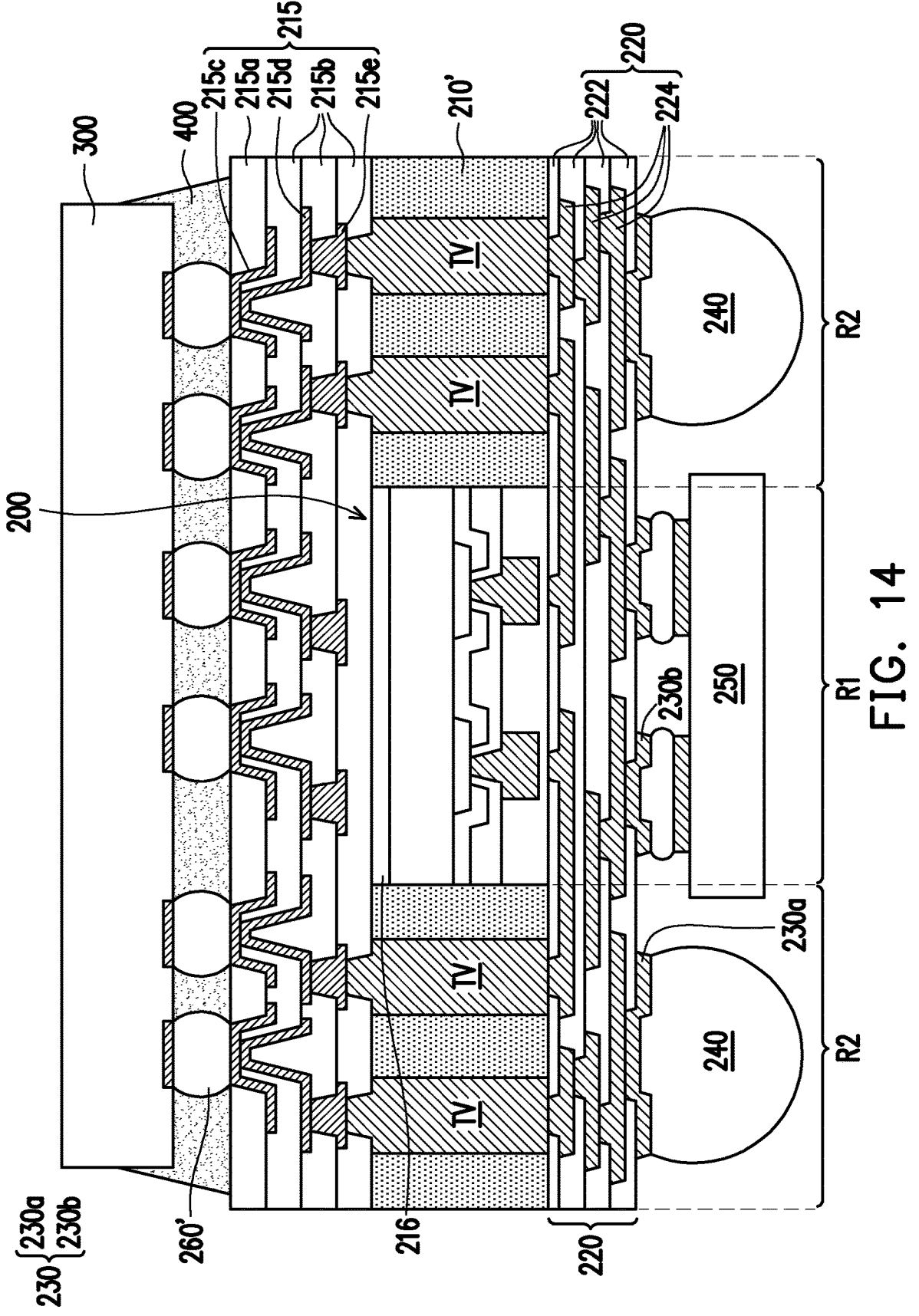
FIG. 14 is a cross-sectional view schematically illustrating a package-on-package (POP) structure in accordance with some embodiments.

Referring to FIG. 13, after performing the de-bonding process, a pre-solder process is performed. During the pre-solder process, solder material 217 is applied onto the revealed surfaces of the outermost redistribution conductive layer 215c. Since the backside dielectric layer 215a is thick enough to reduce the warpage of the resulted structure illustrated in FIG. 13. The material of the revealed backside dielectric layer 215a is suitable for product marking process (e.g., a laser marking process). In the present embodiment, the backside dielectric layer 215a may reduce warpage of the resulted structure illustrated in FIG. 12 as well as provide marking recognition. In other words, product marking may be formed on the surface of the backside dielectric layer 215a through a laser marking process. In some embodiments, the pre-solder process is performed prior to the product marking process. In some other embodiments, the pre-solder process is performed after the product marking process.

Referring to FIG. 14, at least one electronic device (i.e., a package) 300 including conductive terminals 260 formed thereon is provided. The conductive terminals 260 of the electronic device 300 may be or include conductive bumps (e.g., copper bumps, solder bumps or the like). The electronic device 300 is stacked over and electrically connected to the integrated fan-out package illustrated in FIG. 13 through the conductive terminals 260. In some embodiments, the electronic device 300 is electrically connected to the integrated fan-out package illustrated in FIG. 13 by performing a reflow process. After the electronic device 300 is mounted onto and electrically connected to the integrated fan-out package illustrated in FIG. 13, a package-on-package (POP) structure is fabricated. During the reflow process, mutual fusion between the solder material 217 and the conductive terminals 260 occurs and re-shaped conductive terminals 260' are then formed between the electronic device 300 and the integrated fan-out package illustrated in FIG. 13. The electronic device 300 may be or include a memory device, such as a dynamic random access memory (DRAM) device, an static random access memory (SRAM) device, a high bandwidth memory (HBM) device or other suitable types of memory device. The conductive terminals 260' are reflowed to bond with the surfaces of the outermost redistribution conductive layer 215c.

As shown in FIG. 14, after the conductive terminals 240 and the conductive terminals 260' are formed, an integrated fan-out package of the semiconductor die 200 having dual-side terminal design (i.e., the conductive terminals 240 and the conductive terminals 260) is fabricated.

An underfill 400 is then formed on the back-side redistribution layer structure 215 so as to fill the gap between the backside dielectric layer 215a and the electronic device 300. The underfill 400 is in contact with the backside dielectric layer 215a of the back-side redistribution layer structure as well as the electronic device 300. The underfill 400 laterally encapsulates the conductive terminals 260' to protect the conductive terminals 260' from damaged. The material of the underfill 400 may be or include epoxy resin with filler distributed therein.

FIG. 15A through FIG. 15D are cross-sectional views schematically illustrating a process flow for fabricating the redistribution conductive layer 215c in accordance with some embodiments.

Figure 15A:
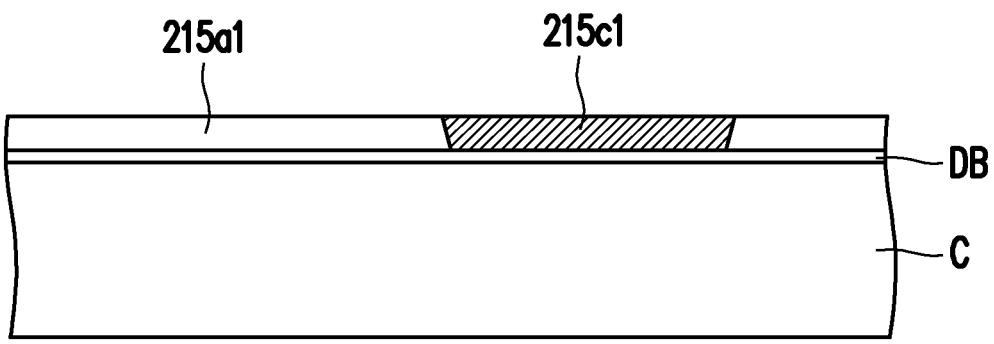
FIG. 15A through FIG. 15D are cross-sectional views schematically illustrating a process flow for fabricating the redistribution conductive layer 215c in accordance with some embodiments.

Referring to FIG. 15A, a dielectric segment 215a1 having at least one opening defined therein is formed on the de-bonding layer DB carried by the carrier C. The dielectric segment 215a1 may be formed by: forming a dielectric material layer on the de-bonding layer DB; patterning the dielectric material layer to form the at least one opening; and curing the patterned dielectric material layer having the at least one opening. The dielectric material layer may be a non-photosensitive dielectric material layer formed by a spin-coating process, and the non-photosensitive dielectric material layer is patterned by a photolithography process followed by an etch process. In some embodiments, after curing the dielectric segment 215a1, a descum process is performed to treat the surface of dielectric segment 215a1 such that surface modification occurs on the surface of the dielectric segment 215al.

After forming the dielectric segment 215a1, at least one conductive segment 215c1 is formed to fill the at least one opening defined in the dielectric segment 215a1 such that the at least one conductive segment 215c1 covers a portion of the de-bonding layer DB revealed by the at least one opening defined in the dielectric segment 215a1. The at least one conductive segment 215c1 may be formed by: performing a sputtering process to deposit a seed layer (e.g., sputtered Ti/Cu seed layer or the like) covering the dielectric segment 215a1 and the revealed portion of the de-bonding layer DB; performing a plating process to form a plated layer (e.g., plated copper layer or the like) on the seed layer; and performing a grinding process (e.g., mechanical grinding process, CMP process, a combination thereof or the like) to remove portions of the plated layer and the seed layer until the top surface of the dielectric segment 215a1 is revealed. As illustrated in FIG. 15A, the top surface of the dielectric segment 215a1 substantially levels with the top surface of the at least one conductive segment 215c1.

Figure 15B:
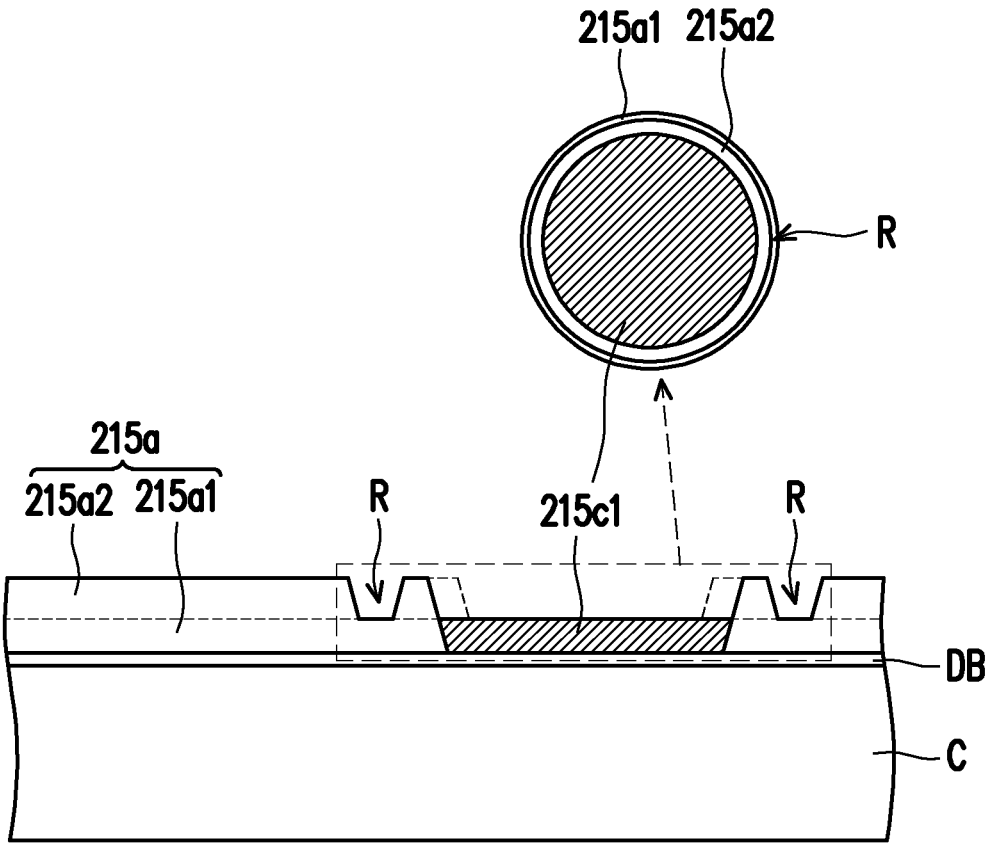

Referring to FIG. 15B, a dielectric segment 215a2 a having at least one opening and a recess R distributed therein is formed on the dielectric segment 215a1 such that the backside dielectric layer 215a including the dielectric segment 215a1 and the dielectric segment 215a2 is formed. The recess R may include a ring-shaped recess, a curved-shape recess or the like. The at least one opening defined in the dielectric segment 215a2 is located above the at least one opening defined in the dielectric segment 215a1. The material of the dielectric segment 215a1 may be the same as or different from that of the dielectric segment 215a2. After forming the dielectric segment 215a2, the top surface of the underlying dielectric segment 215a1 is partially revealed by the recess R (e.g., the ring-shaped recess) defined in the dielectric segment 215a2. The recess R (e.g., the ring-shaped recess) is laterally spaced apart from the at least one opening defined in the dielectric segment 215a2. The at least one opening defined in the dielectric segment 215a2 is laterally surrounded by the recess R (e.g., the ring-shaped recess). The at least one opening defined in the dielectric segment 215a2 may be wider than the at least one opening defined in the dielectric segment 215a1 such that the at least one conductive segment 215c1 is revealed by the at least one opening defined in the dielectric segment 215a2. The dielectric segment 215a2 may be formed by: forming a dielectric material layer on the dielectric segment 215a1; patterning the dielectric material layer; and curing the patterned dielectric material layer. The dielectric material layer may be a non-photosensitive dielectric material layer formed by a spin-coating process, and the non-photosensitive dielectric material layer may be patterned by a photolithography process followed by an etch process.

In some other embodiments, as illustrated by dotted line shown in FIG. 15B, the dielectric segment 215a2 further covers a periphery region of the revealed top surface of the at least one conductive segment 215c1.

Figure 15C:
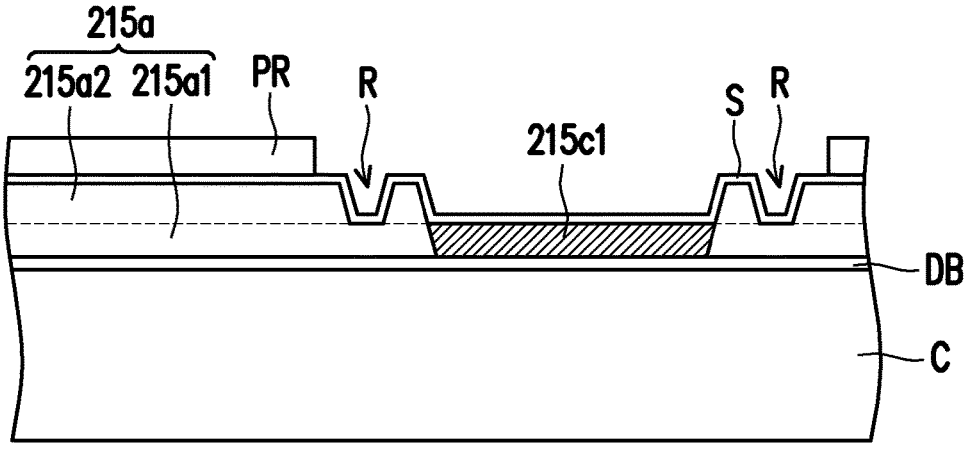

Referring to FIG. 15C, a seed layer S (e.g., a sputtered Ti/Cu seed layer or the like) is conformally deposited on the top surface of the dielectric segment 215a2, the revealed top surface of the at least one conductive segment 215c1 as well as a portion of the top surface of the dielectric segment 215a1 revealed by the recess R (e.g., the ring-shaped recess). Then, a patterned photoresist layer PR having at least one opening is formed on the top surface of seed layer S such that a portion of the seed layer S is revealed by the at least one opening defined in the patterned photoresist layer PR. As illustrated in FIG. 15C, the at least one opening defined in the patterned photoresist layer PR is located above the recess R (e.g., the ring-shaped recess), a portion of the dielectric segment 215a2 and the at least one conductive segment 215c1. A portion of the seed layer S is revealed by the patterned photoresist layer PR. The portion of the seed layer S revealed by the at least one opening defined in the patterned photoresist layer PR may cover a portion of the dielectric segment 215a2 and the at least one conductive segment 215c1. The at least one opening defined in the patterned photoresist layer PR is wider than the openings defined in the dielectric segments 215a1 and 215a2. In some embodiments, after forming the patterned photoresist layer PR, a descum process is performed to treat the surface of dielectric segment 215a2 such that surface modification occurs on the top surface of the dielectric segment 215a2.

Figure 15D:
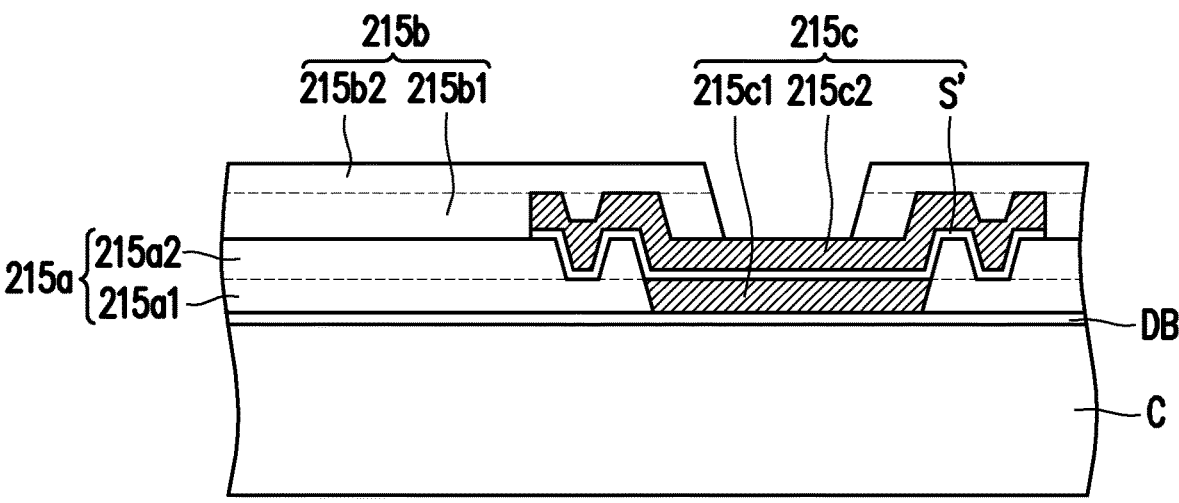

Referring to FIG. 15C and FIG. 15D, a plating process for forming a plated layer or conductive segment 215c2 (e.g., plated copper layer or the like) on the revealed portion of the seed layer S is performed. The plated layer or conductive segment 215c2 is formed to fill the at least one opening defined in the patterned photoresist layer PR. The plated layer or conductive segment 215c2 covers the conductive segment 215c1. Then, the patterned photoresist layer PR is removed through, for example, a photoresist stripping process. After removing the patterned photoresist layer PR, the seed layer S uncovered by the plated layer or conductive segment 215c2 is removed to reveal a portion of the top surface of the dielectric segment 215a2 such that the redistribution conductive layer 215c including the conductive segment 215c1, a patterned seed layer S' and the plated layer 215c2 is formed. The redistribution conductive layer 215c covers the dielectric segments 215a1 and 215a2 and is embedded in the recess R (e.g., the ring-shaped recess). The patterned seed layer S' is between the conductive segment 215c1 and the plated layer 215c2. The outermost redistribution conductive layer 215c is disposed in the openings defined in the dielectric segments 215a1 and 215a2, and the outermost redistribution conductive layer 215c extends to cover the recess R (e.g., the ring-shaped recess) distributed in the second dielectric segment 215a2. As illustrated in FIG. 15D, the conductive segment 215c1 is bottom region, and the patterned seed layer S' and the plated layer 215c2 extend to cover the recess R (e.g., the ring-shaped recess) distributed in the second dielectric segment 215a2.

A bottommost inter-dielectric layer 215b is then formed on the dielectric segment 215a2 of the backside dielectric layer 215a as well as the plated layer 215c2. In some embodiments, the bottommost inter-dielectric layer 215b includes a dielectric segment 215b1 and a dielectric segment 215b2 covering the dielectric segment 215b1. The material of the dielectric segment 215b1 may be the same as or different from that of the dielectric segment 215b2.

The dielectric segment 215*b*1 may be formed by: forming a dielectric material layer on the dielectric segment 215*a*2 of the backside dielectric layer 215*a* as well as the plated layer 215*c*2; patterning the dielectric material layer; and curing the patterned dielectric material layer. The dielectric material layer may be a non-photosensitive dielectric material layer formed by a spin-coating process, and the non-photosensitive dielectric material layer may be patterned by a photolithography process followed by an etch process. In some embodiments, after curing the dielectric segment 215*b*1, a descum process is performed to treat the surface of the dielectric segment 215*b*1 such that surface modification occurs on the surface of the dielectric segment 215*b*1. The dielectric segment 215*b*2 is then formed on the dielectric segment 215*b*1. Thereafter, the dielectric segment 215*b*2 are patterned through a photolithography process followed by an etch process. In other words, the dielectric segment 215*b*1 and the dielectric segment 215*b*2 are patterned through a photolithography process followed by an etch process, respectively. In some alternative embodiments, the patterning process of the dielectric segment 215*b*1 and the dielectric segment 215*b*2 includes a single photolithography process followed by an etch process.

After forming the bottommost inter-dielectric layer 215*b*, the plated layer 215*c*2 of the redistribution conductive layer 215*c* is partially revealed by the opening defined in the bottommost inter-dielectric layer 215*b*. The opening defined in the bottommost inter-dielectric layer 215*b* is smaller than the openings defined in the backside dielectric layer 215*a*.

As illustrated in FIG. 15D, since the patterned seed layer S' and the plated layer 215*c*2 of the redistribution conductive layer 215*c* are embedded in the recess R (e.g., the ring-shaped recess) defined in the backside dielectric layer 215*a*, the delamination issue generated at the interface between the redistribution conductive layer 215*c* and the backside dielectric layer 215*a* can be solved.

FIG. 16A through FIG. 16F are cross-sectional views schematically illustrating a process flow for fabricating the redistribution conductive layer 215*c* in accordance with some other embodiments.

Figure 16A:
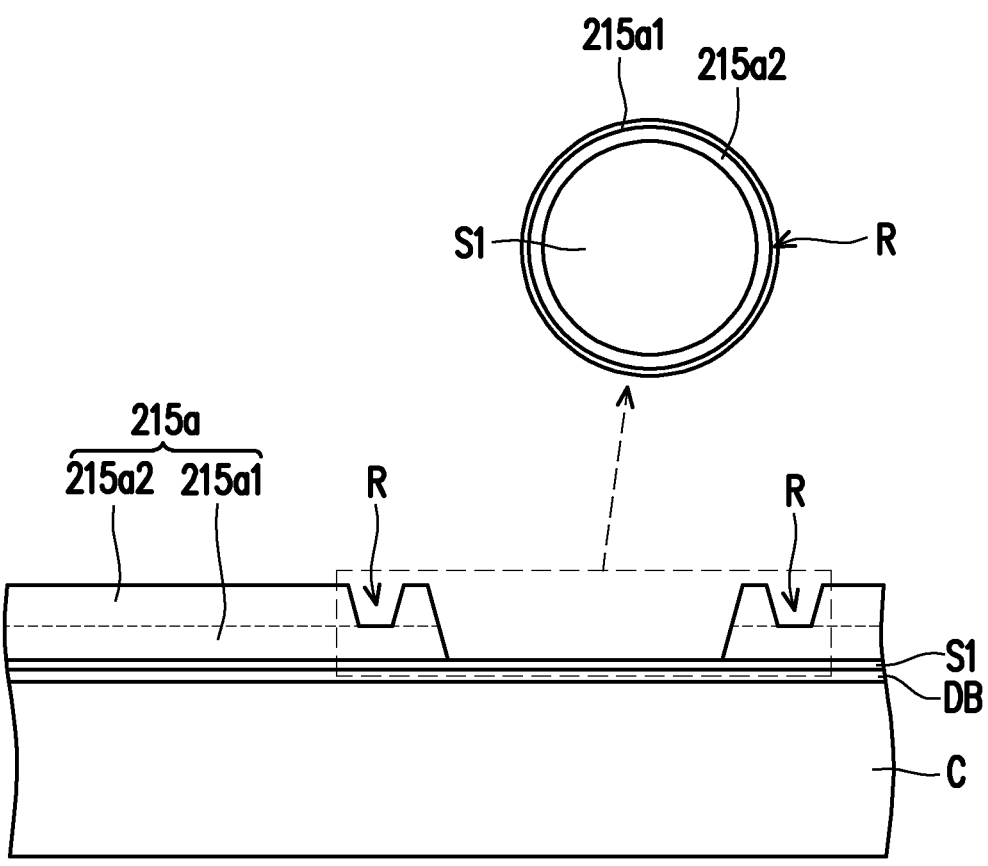
FIG. 16A through FIG. 16F are cross-sectional views schematically illustrating a process flow for fabricating the redistribution conductive layer 215c in accordance with some other embodiments.

Referring to FIG. 16A, a seed layer S1 (e.g., a sputtered Ti/Cu seed layer or the like) is deposited on a de-bonding layer DB carried by a carrier C. Then, a backside dielectric layer 215*a* including the dielectric segment 215*a*1 and the dielectric segment 215*a*2 covering the dielectric segment 215*a*1 is formed on the de-bonding layer DB. The backside dielectric layer 215*a* includes at least one opening, wherein the at least one opening penetrates through the dielectric segments 215*a*1 and 215*a*2, and the dielectric segment 215*a*2 of the backside dielectric layer 215*a* further includes a recess R (e.g., the ring-shaped recess) laterally surrounds the at least one opening defined in the backside dielectric layer 215*a*. In the present embodiment, the recess R (e.g., the ring-shaped recess) and the at least one opening defined in the backside dielectric layer 215*a* are formed through a single photolithography process followed by an etch process. Since the width of the recess R (e.g., the ring-shaped recess) is smaller than the lateral dimension of the at least one opening defined in the backside dielectric layer 215*a*, the etching depth of the recess R (e.g., the ring-shaped recess) is smaller than the thickness of the backside dielectric layer 215*a*. The etching depth of the recess R (e.g., the ring-shaped recess) relates to the predetermined width of the recess R (e.g., the ring-shaped recess). In other words, etching depth of the recess R (e.g., the ring-shaped recess) can be determined or controlled by the predetermined width of the recess R (e.g., the ring-shaped recess). Accordingly, through properly controlling of the etching recipe and the width of the recess R (e.g., the ring-shaped recess), the ring-shaped recess and the at least one opening defined in the backside dielectric layer 215*a* may be formed simultaneously by a single photolithography process followed by an etch process.

Figure 16B:
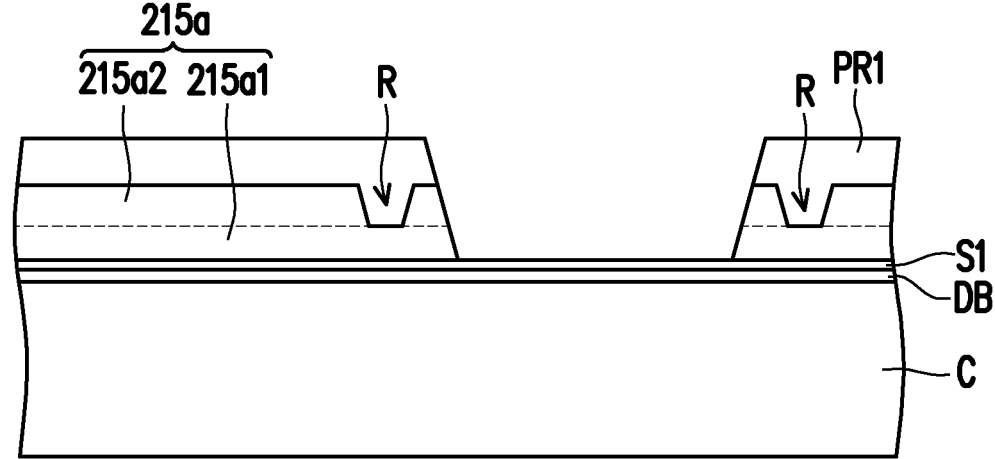

Referring to FIG. 16B, a patterned photoresist layer PR1 having at least one opening is formed on the top surface of the seed layer S1 such that a portion of the seed layer S1 is revealed by the at least one opening defined in the patterned photoresist layer PR1. As illustrated in FIG. 16B, the at least one opening defined in the patterned photoresist layer PR1 is located above the at least one opening defined in the backside dielectric layer 215*a*. The recess R (e.g., the ring-shaped recess) is covered by the patterned photoresist layer PR1. The at least one opening defined in the patterned photoresist layer PR1 is wider than the openings defined in the backside dielectric layer 215*a*. Sidewall of the opening defined in the backside dielectric layer 215*a* is exposed by the opening defined in the patterned photoresist layer PR1. In some embodiments, after forming the patterned photoresist layer PR1, a descum process is performed to treat the surface of dielectric segment 215*a*2 of the backside dielectric layer 215*a* such that surface modification occurs on the top surface of the dielectric segment 215*a*2.

Figure 16C:
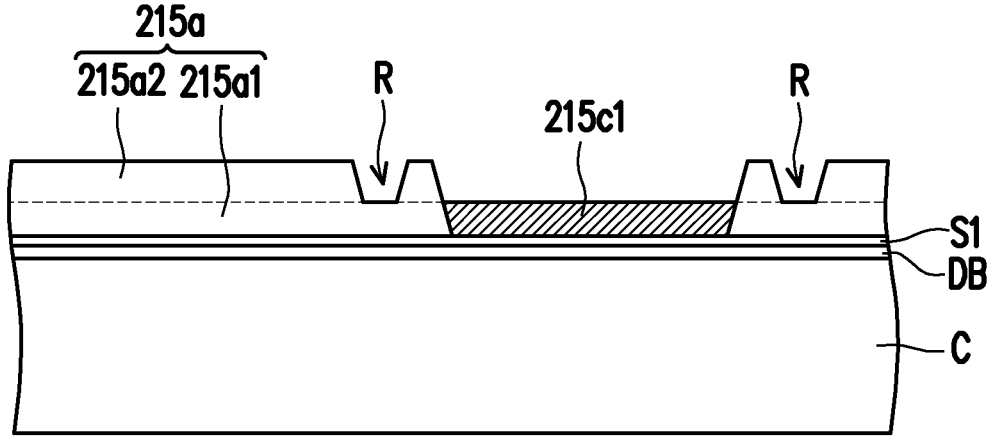

Referring to FIG. 16C, after forming the patterned photoresist layer PR1, at least one conductive segment 215*c*1 is formed to fill the at least one opening defined in the backside dielectric layer 215*a* such that the at least one conductive segment 215*c*1 covers a portion of the seed layer S1 revealed by the at least one opening defined in the backside dielectric layer 215*a*. The at least one conductive segment 215*c*1 may be formed by performing a plating process to form a plated layer (e.g., plated copper layer or the like) on the seed layer S1 so as to partially fill the at least one opening defined in the backside dielectric layer 215*a*. As illustrated in FIG. 16C, the top surface of the backside dielectric layer 215*a* is located at a level height higher than that of the top surface of the at least one conductive segment 215*c*1. In some embodiments, the thickness of the at least one conductive segment 215*c*1 substantially equal to the thickness of the dielectric segment 215*a*1. In some other embodiments, the thickness of the at least one conductive segment 215*c*1 is greater than or less than the thickness of the dielectric segment 215*a*1.

Figure 16D:
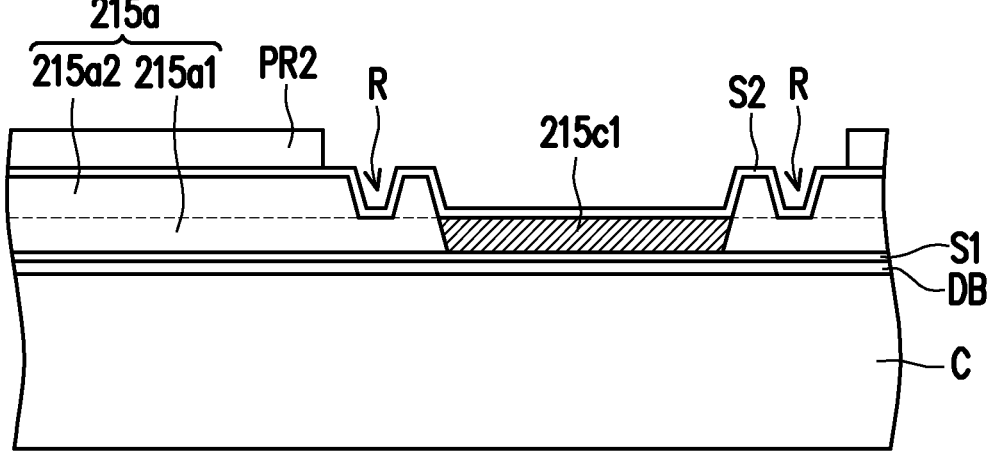

Referring to FIG. 16D, a seed layer S2 (e.g., a sputtered Ti/Cu seed layer or the like) is conformally deposited on the top surface of the backside dielectric layer 215*a* and the revealed top surface of the at least one conductive segment 215*c*1. Then, a patterned photoresist layer PR2 having at least one opening is formed on the top surface of seed layer S2 such that a portion of the seed layer S2 is revealed by the at least one opening defined in the patterned photoresist layer PR2. As illustrated in FIG. 16D, the at least one opening defined in the patterned photoresist layer PR2 is located above the recess R (e.g., the ring-shaped recess), a portion of the backside dielectric layer 215*a* and the at least one conductive segment 215*c*1. A portion of the seed layer S2 is revealed by the patterned photoresist layer PR2. The portion of the seed layer S2 revealed by the at least one opening defined in the patterned photoresist layer PR2 may cover a portion of the backside dielectric layer 215*a* and the at least one conductive segment 215*c*1. The at least one opening defined in the patterned photoresist layer PR2 is wider than the openings defined in the backside dielectric layer 215*a*. In some embodiments, after forming the patterned photoresist layer PR2, a descum process is performed to treat the surface of the backside dielectric layer 215a such that surface modification occurs on the top surface of the backside dielectric layer 215a.

Figure 16E:
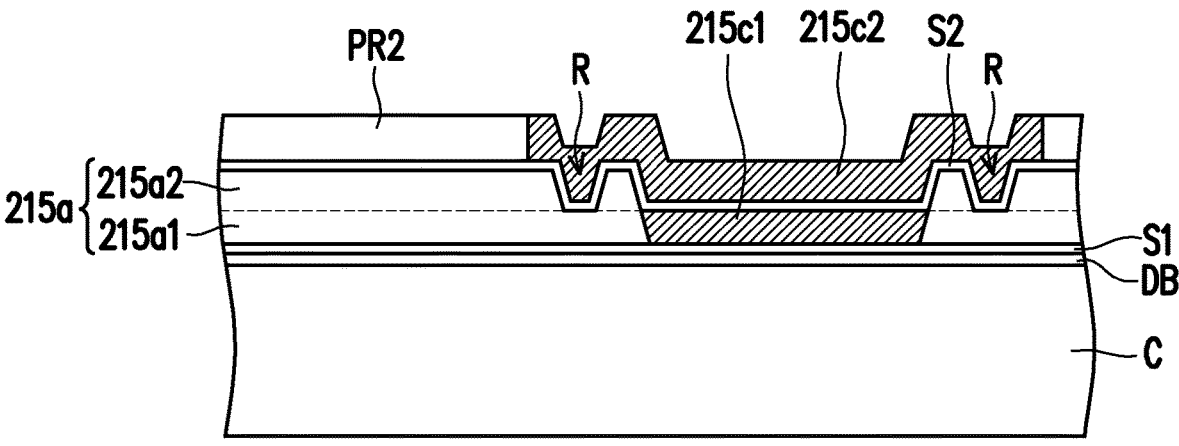

Referring to FIG. 16D and FIG. 16E, a plating process for forming a plated layer 215c2 (e.g., plated copper layer or the like) on the revealed portion of the seed layer S2 is performed. The plated layer 215c2 is formed to fill the at least one opening defined in the patterned photoresist layer PR2. Then, the patterned photoresist layer PR2 is removed through, for example, a photoresist stripping process. After removing the patterned photoresist layer PR2, the seed layer S2 uncovered by the plated layer 215c2 is removed to reveal a portion of the top surface of the backside dielectric layer 215a such that the redistribution conductive layer 215c including the conductive segment 215c1, a patterned seed layer S2' and the plated layer 215c2 is formed. The redistribution conductive layer 215c covers the backside dielectric layer 215a and is embedded in the recess R (e.g., the ring-shaped recess). The patterned seed layer S2' is between the conductive segment 215c1 and the plated layer 215c2.

Figure 16F:
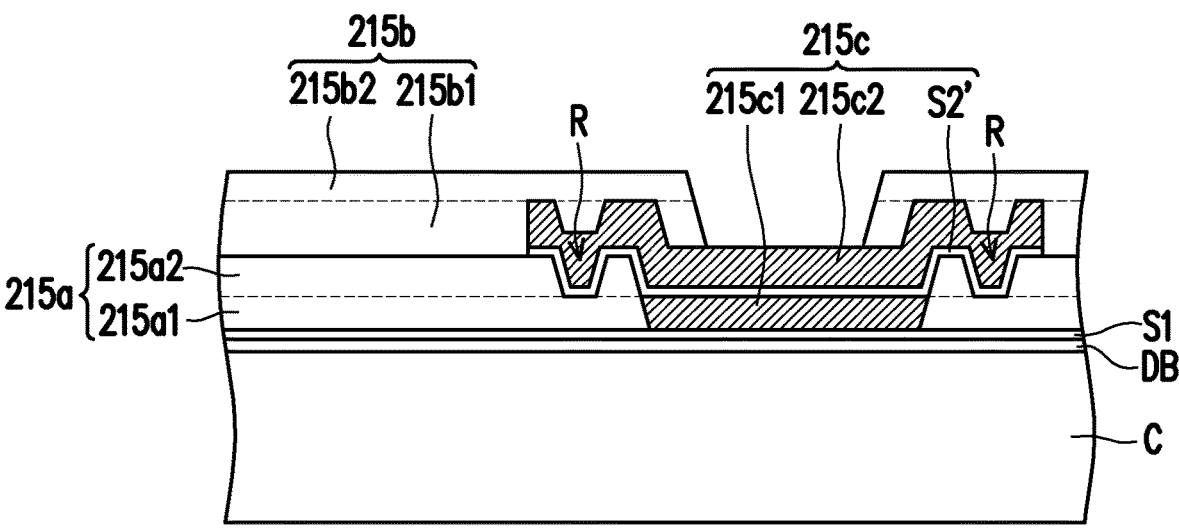

Referring to FIG. 16F, a bottommost inter-dielectric layer 215b is then formed on the dielectric segment 215a2 of the backside dielectric layer 215a as well as the plated layer 215c2. In some embodiments, the bottommost inter-dielectric layer 215b includes a dielectric segment 215b1 and a dielectric segment 215b2 covering the dielectric segment 215b1. The material of the dielectric segment 215b1 may be the same as or different from that of the dielectric segment 215b2.

The dielectric segment 215b1 may be formed by: forming a dielectric material layer on the dielectric segment 215a2 of the backside dielectric layer 215a as well as the plated layer 215c2; patterning the dielectric material layer; and curing the patterned dielectric material layer. The dielectric material layer may be a non-photosensitive dielectric material layer formed by a spin-coating process, and the non-photosensitive dielectric material layer may be patterned by a photolithography process followed by an etch process. In some embodiments, after curing the dielectric segment 215b1, a descum process is performed to treat the surface of the dielectric segment 215b1 such that surface modification occurs on the surface of the dielectric segment 215b1. The dielectric segment 215b2 is then formed on the dielectric segment 215b1. Thereafter, the dielectric segment 215b2 are patterned through a photolithography process followed by an etch process. In other words, the dielectric segment 215b1 and the dielectric segment 215b2 are patterned through a photolithography process followed by an etch process, respectively. In some alternative embodiments, the patterning process of the dielectric segment 215b1 and the dielectric segment 215b2 includes a single photolithography process followed by an etch process.

After forming the bottommost inter-dielectric layer 215b, the plated layer 215c2 of the redistribution conductive layer 215c is partially revealed by the opening defined in the bottommost inter-dielectric layer 215b. The opening defined in the bottommost inter-dielectric layer 215b is smaller than the openings defined in the backside dielectric layer 215a.

It is noted that the seed layer S1 formed between the de-bonding layer DB and the backside dielectric layer 215a may be removed after performing the de-bonding process of the de-bonding layer DB and the carrier C as illustrated in FIG. 12.

As illustrated in FIG. 16F, since the patterned seed layer S2' and the plated layer 215c2 of the redistribution conductive layer 215c are embedded in the recess R (e.g., the ring-shaped recess) defined in the backside dielectric layer 215a, the delamination issue generated at the interface between the redistribution conductive layer 215c and the backside dielectric layer 215a can be solved.

FIG. 17A through FIG. 17E are cross-sectional views schematically illustrating a process flow for fabricating the redistribution conductive layer 215c in accordance with some alternative embodiments.

Figure 17A:
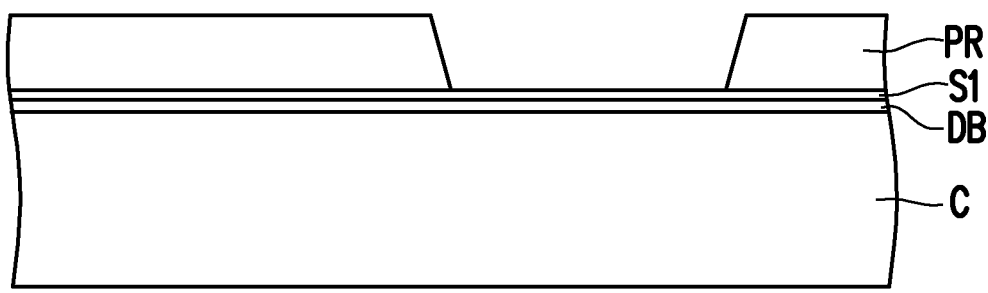
FIG. 17A through FIG. 17E are cross-sectional views schematically illustrating a process flow for fabricating the redistribution conductive layer 215c in accordance with some alternative embodiments.

Referring to FIG. 17A, a seed layer S1 (e.g., a sputtered Ti/Cu seed layer or the like) is deposited on a de-bonding layer DB carried by a carrier C. Then, a patterned photoresist layer PR having at least one opening is formed on the top surface of the seed layer S1 such that a portion of the seed layer S1 is revealed by the at least one opening defined in the patterned photoresist layer PR.

Figure 17B:
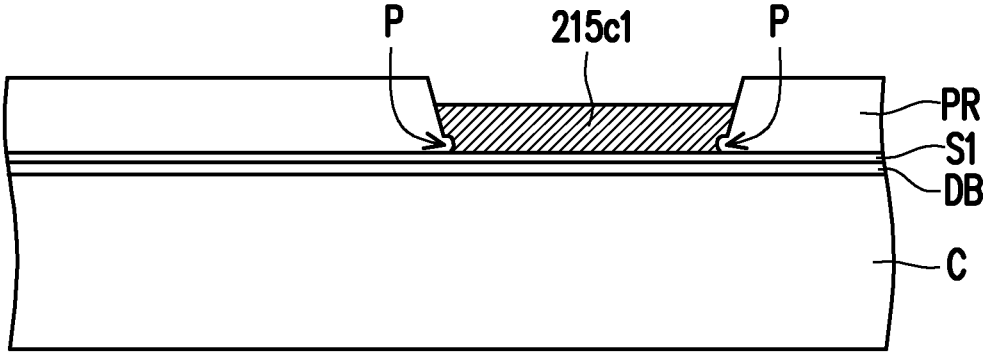

Referring to FIGS. 17A and FIG. 17B, after forming the patterned photoresist layer PR, a descum process is performed to treat the sidewall of the opening defined in the patterned photoresist layer PR such that the sidewall of the opening defined in the patterned photoresist layer PR includes a protrusion P (e.g., a ring-shaped protrusion). The protrusion P laterally protrude from the sidewall of the opening defined in the patterned photoresist layer PR. The protrusion P is a ring-shaped structure located at the bottom of the opening defined in the patterned photoresist layer PR. The ring-shaped protrusion P is in contact with the seed layer S1. As illustrated in FIG. 17B, the opening defined in the patterned photoresist layer PR may have a top lateral dimension and a bottom lateral dimension smaller the top lateral dimension.

In some embodiments, the protrusion P is formed through a removal process (e.g., an ash process or the like) of the patterned photoresist layer PR, an upper portion of the opening defined in the patterned photoresist layer PR is widen such that the protrusion P is formed at the bottom of the opening defined in the patterned photoresist layer PR.

After performing the descum process of the patterned photoresist layer PR, at least one conductive segment 215c1 is formed to fill the at least one opening defined in the patterned photoresist layer PR such that the at least one conductive segment 215c1 covers a portion of the seed layer S1 revealed by the at least one opening defined in the patterned photoresist layer PR. The at least one conductive segment 215c1 may be formed by performing a plating process to form a plated layer (e.g., plated copper layer or the like) on the seed layer S1 so as to partially fill the at least one opening defined in the patterned photoresist layer PR. As illustrated in FIG. 17B, the top surface of the patterned photoresist layer PR is located at a level height higher than that of the top surface of the at least one conductive segment 215c1.

Figure 17C:
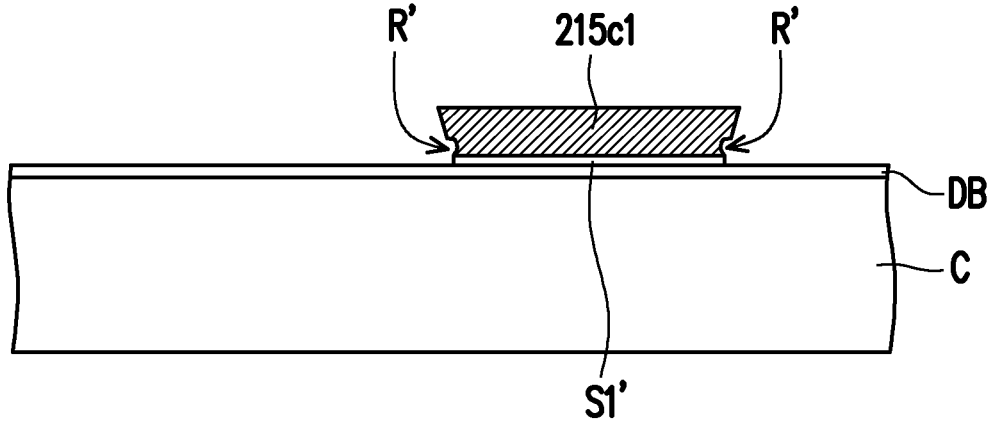

Referring to FIG. 17C, a removal process of the patterned photoresist layer PR is performed. The patterned photoresist layer PR is removed through, for example, a photoresist stripping process. After removing the patterned photoresist layer PR, the seed layer S1 uncovered by the at least one conductive segment 215c1 is removed to reveal the de-bonding layer DB such that a patterned seed layer S1' is formed between the at least one conductive segment 215c1 and t the de-bonding layer DB. As illustrated in FIG. 17C, a recess R' (e.g., a ring-shaped recess) is formed on the sidewall of the at least one conductive segment 215c1, and the ring-shaped recess R' is located in proximity to the patterned seed layer S1'.

Figure 17D:
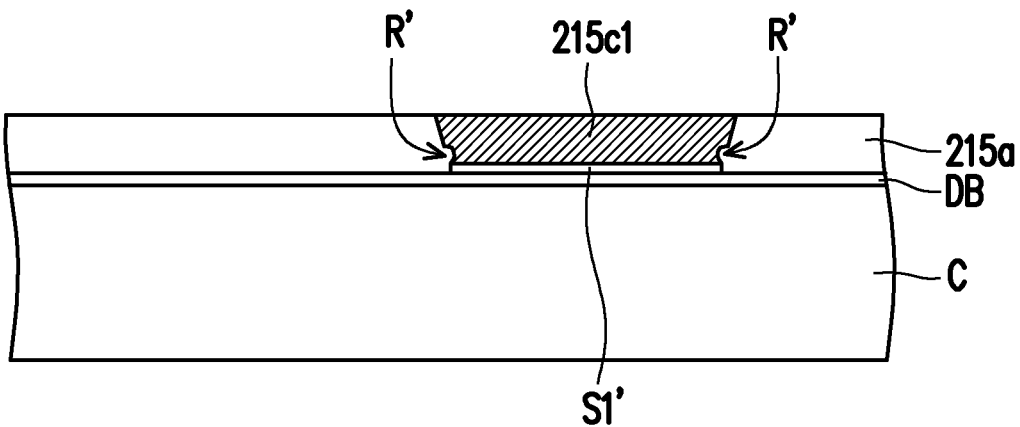

Referring to FIG. 17D, a backside dielectric layer 215a is formed on the de-bonding layer DB to laterally encapsulate the at least one conductive segment 215c1 and the patterned seed layer S1'. A dielectric material layer may be formed on the de-bonding layer DB to cover the at least one conductive segment 215c1 and the patterned seed layer S1', wherein the thickness of the dielectric material layer is greater than the total thickness of the at least one conductive segment 215c1 and the patterned seed layer S1'. Then, a grinding process (e.g., mechanical grinding process, CMP process, a combination thereof or the like) may be performed to partially remove (e.g., thin down) the dielectric material layer until the top surface of the at least one conductive segment 215c1 is revealed. After performing the above-mentioned grinding process, the backside dielectric layer 215a laterally encapsulating the at least one conductive segment 215c1 and the patterned seed layer S1' is formed on the de-bonding layer DB. As illustrated in FIG. 17D, the top surface of the at least one conductive segment 215c1 substantially levels with the top surface of the backside dielectric layer 215a. The backside dielectric layer 215a fills the ring-shaped recess R' and the adhesion between the backside dielectric layer 215a and the at least one conductive segment 215c1 may be enhanced. Accordingly, delamination issue generated at the interface between the backside dielectric layer 215a and the at least one conductive segment 215c1 can be solved.

Figure 17E:
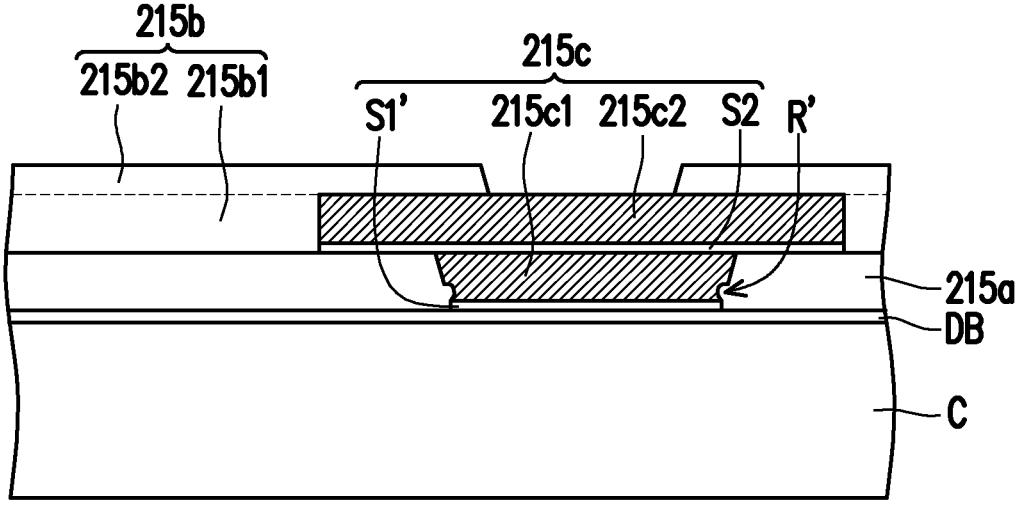

Referring to FIG. 17E, a seed layer (e.g., a sputtered Ti/Cu seed layer or the like) is conformally deposited on the top surface of the backside dielectric layer 215a and the revealed top surface of the at least one conductive segment 215c1. Then, a patterned photoresist layer having at least one opening is formed on the top surface of seed layer such that a portion of the seed layer is revealed by the at least one opening defined in the patterned photoresist layer. The portion of the seed layer revealed by the at least one opening defined in the patterned photoresist layer may cover a portion of the backside dielectric layer 215a and the at least one conductive segment 215c1. The at least one opening defined in the patterned photoresist layer is wider than the openings defined in the backside dielectric layer 215a. In some embodiments, after forming the patterned photoresist layer, a descum process is performed to treat the surface of the backside dielectric layer 215a such that surface modification occurs on the top surface of the backside dielectric layer 215a.

Referring to FIG. 17E, a plating process for forming a plated layer 215c2 (e.g., plated copper layer or the like) on the revealed portion of the seed layer is performed. The plated layer 215c2 is formed to fill the at least one opening defined in the patterned photoresist layer. Then, the patterned photoresist layer is removed through, for example, a photoresist stripping process. After removing the patterned photoresist layer, the seed layer uncovered by the plated layer 215c2 is removed to reveal a portion of the top surface of the backside dielectric layer 215a such that the redistribution conductive layer 215c including the conductive segment 215c1, a patterned seed layer S1', a patterned seed layer S2 and the plated layer 215c2 is formed, wherein patterned seed layer S2 is between the conductive segment 215c1 and the plated layer 215c2.

As illustrated in FIG. 17E, a bottommost inter-dielectric layer 215b is then formed on the backside dielectric layer 215a as well as the plated layer 215c2. In some embodiments, the bottommost inter-dielectric layer 215b includes a dielectric segment 215b1 and a dielectric segment 215b2 covering the dielectric segment 215b1. The material of the dielectric segment 215b1 may be the same as or different from that of the dielectric segment 215b2.

The dielectric segment 215b1 may be formed by: forming a dielectric material layer on the dielectric segment 215a2 of the backside dielectric layer 215a as well as the plated layer 215c2; patterning the dielectric material layer; and curing the patterned dielectric material layer. The dielectric material layer may be a non-photosensitive dielectric material layer formed by a spin-coating process, and the non-photosensitive dielectric material layer may be patterned by a photolithography process followed by an etch process. In some embodiments, after curing the dielectric segment 215b1, a descum process is performed to treat the surface of the dielectric segment 215b1 such that surface modification occurs on the surface of the dielectric segment 215b1. The dielectric segment 215b2 is then formed on the dielectric segment 215b1. Thereafter, the dielectric segment 215b2 are patterned through a photolithography process followed by an etch process. In other words, the dielectric segment 215b1 and the dielectric segment 215b2 are patterned through a photolithography process followed by an etch process, respectively. In some alternative embodiments, the patterning process of the dielectric segment 215b1 and the dielectric segment 215b2 includes a single photolithography process followed by an etch process. An interface between the dielectric segment 215b1 and the dielectric segment 215b2 substantially levels with the top surface of the plated layer 215c2 of the redistribution conductive layer 215c.

After forming the bottommost inter-dielectric layer 215b, the plated layer 215c2 of the redistribution conductive layer 215c is partially revealed by the opening defined in the bottommost inter-dielectric layer 215b. The opening defined in the bottommost inter-dielectric layer 215b is smaller than the openings defined in the backside dielectric layer 215a.

FIG. 18A through FIG. 18D are cross-sectional views schematically illustrating a process flow for fabricating the redistribution conductive layer 215c in accordance with some other embodiments.

Figure 18A:
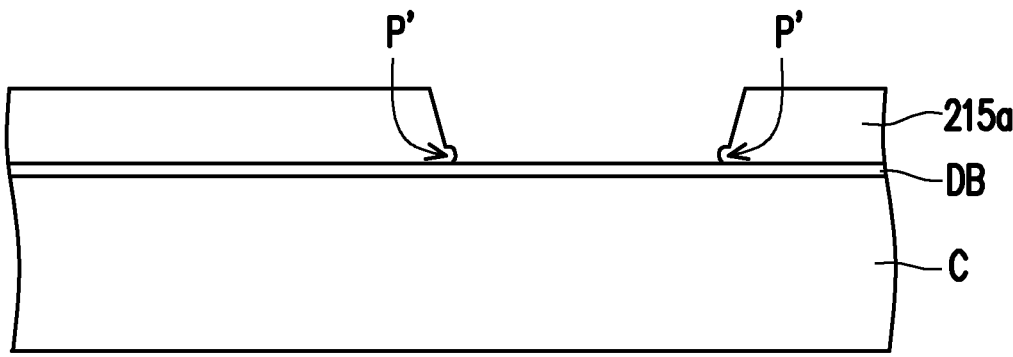
FIG. 18A through FIG. 18D are cross-sectional views schematically illustrating a process flow for fabricating the redistribution conductive layer 215c in accordance with some other embodiments.

Referring to FIG. 18A, a backside dielectric layer 215a having at least one opening is formed on the top surface of the de-bonding layer DB such that a portion of the de-bonding layer DB is revealed by the at least one opening defined in the backside dielectric layer 215a. After forming the backside dielectric layer 215a, a descum process is performed to treat the sidewall of the opening defined in the backside dielectric layer 215a such that the sidewall of the opening defined in the backside dielectric layer 215a includes a protrusion P' (e.g., a ring-shaped protrusion). The protrusion P' laterally protrude from the sidewall of the opening defined in the backside dielectric layer 215a. The protrusion P' is a ring-shaped structure located at the bottom of the opening defined in the backside dielectric layer 215a. The protrusion P' is in contact with the de-bonding layer DB. As illustrated in FIG. 18A, the opening defined in the backside dielectric layer 215a may have a top lateral dimension and a bottom lateral dimension smaller the top lateral dimension. In some embodiments, the protrusion P' is formed through a removal process (e.g., an ash process or the like) of the backside dielectric layer 215a, an upper portion of the opening defined in the backside dielectric layer 215a is widen such that the protrusion P' is formed at the bottom of the opening defined in the backside dielectric layer 215a.

Figure 18B:
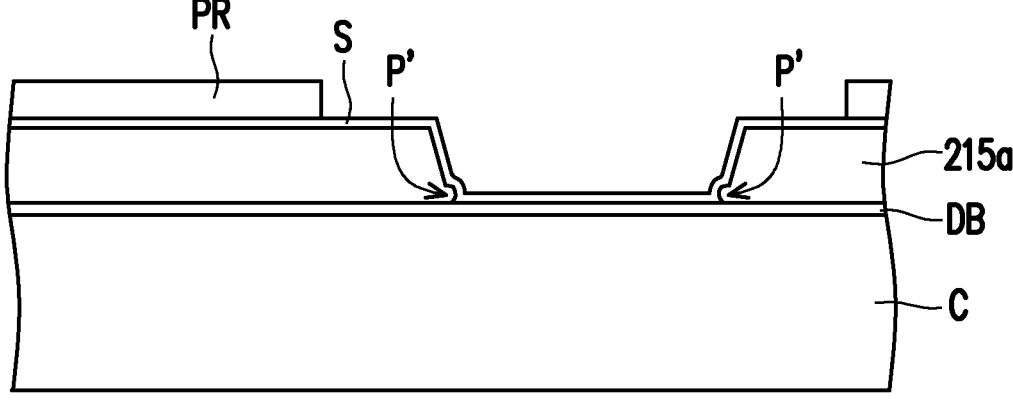

Referring to FIG. 18B, after performing the descum process of the backside dielectric layer 215a, a seed layer S (e.g., a sputtered Ti/Cu seed layer or the like) is deposited on the revealed portion of the de-bonding layer DB and the backside dielectric layer 215a. Then, a patterned photoresist layer PR having at least one opening is formed on the top surface of the seed layer S such that a portion of the seed layer S is revealed by the at least one opening defined in the patterned photoresist layer PR.

Figure 18C:
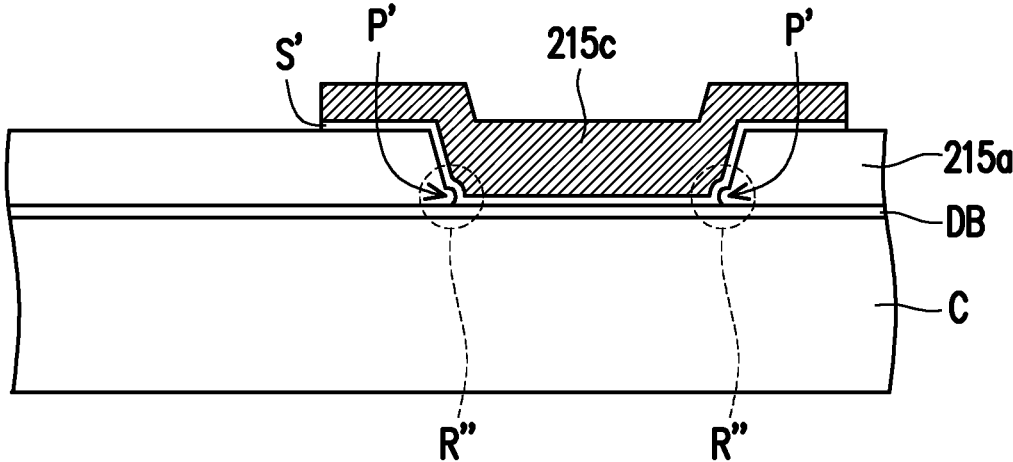

Referring to FIG. 18B and FIG. 18C, after forming the patterned photoresist layer PR, at least one conductive segment 215*c* is formed to fill the at least one opening defined in the patterned photoresist layer PR such that the at least one conductive segment 215*c* covers a portion of the seed layer S revealed by the at least one opening defined in the patterned photoresist layer PR. Then, the patterned photoresist layer PR is removed through, for example, a photoresist stripping process. After removing the patterned photoresist layer PR, the seed layer S uncovered by the plated layer 215*c* is removed to reveal a portion of the top surface of the backside dielectric layer 215*a* such that a patterned seed layer S' underlying the conductive segment 215*c* is formed.

Figure 18D:
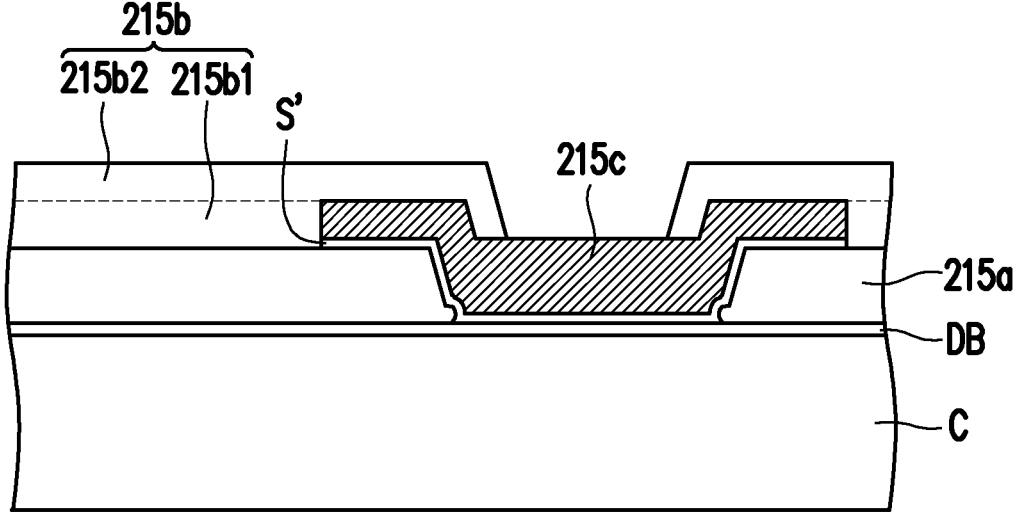

As illustrated in FIG. 18D, a bottommost inter-dielectric layer 215*b* is then formed on the backside dielectric layer 215*a* as well as the conductive segment 215*c*. In some embodiments, the bottommost inter-dielectric layer 215*b* includes a dielectric segment 215*b*1 and a dielectric segment 215*b*2 covering the dielectric segment 215*b*1. The material of the dielectric segment 215*b*1 may be the same as or different from that of the dielectric segment 215*b*2.

The dielectric segment 215*b*1 may be formed by: forming a dielectric material layer on the dielectric segment 215*a*2 of the backside dielectric layer 215*a* as well as the conductive segment 215*c*; patterning the dielectric material layer; and curing the patterned dielectric material layer. The dielectric material layer may be a non-photosensitive dielectric material layer formed by a spin-coating process, and the non-photosensitive dielectric material layer may be patterned by a photolithography process followed by an etch process. In some embodiments, after curing the dielectric segment 215*b*1, a descum process is performed to treat the surface of the dielectric segment 215*b*1 such that surface modification occurs on the surface of the dielectric segment 215*b*1. The dielectric segment 215*b*2 is then formed on the dielectric segment 215*b*1. Thereafter, the dielectric segment 215*b*2 are patterned through a photolithography process followed by an etch process. In other words, the dielectric segment 215*b*1 and the dielectric segment 215*b*2 are patterned through a photolithography process followed by an etch process, respectively. In some alternative embodiments, the patterning process of the dielectric segment 215*b*1 and the dielectric segment 215*b*2 includes a single photolithography process followed by an etch process. An interface between the dielectric segment 215*b*1 and the dielectric segment 215*b*2 substantially levels with the top surface of the conductive segment 215*c*.

After forming the bottommost inter-dielectric layer 215*b*, the conductive segment 215*c* is partially revealed by the opening defined in the bottommost inter-dielectric layer 215*b*. The opening defined in the bottommost inter-dielectric layer 215*b* is smaller than the openings defined in the backside dielectric layer 215*a*.

In the above-mentioned embodiments, the recess R, the recess R", the protrusion P and/or the protrusion P', may enhance the adhesion between the redistribution conductive layer 215*c* and the backside dielectric layer 215*a* such that delamination issue generated at the interface between the backside dielectric layer 215*a* and the redistribution conductive layer 215*c* can be solved. In other words, the above-mentioned ring-shaped structure(s) may provide an adhesion enhancement interface, and accordingly, the reliability of the back-side redistribution layer structure 215 may be improved.

In accordance with some embodiments of the present disclosure, a package structure including a semiconductor die, a redistribution layer structure and an electronic device is provided. The semiconductor die is laterally encapsulated by an insulating encapsulation. The redistribution layer structure is disposed on the semiconductor die and the insulating encapsulation. The redistribution layer structure includes a backside dielectric layer, inter-dielectric layers and redistribution conductive layers embedded in the backside dielectric layer and the inter-dielectric layers. The electronic device is disposed over the backside dielectric layer and electrically connected to an outermost redistribution conductive layer among the redistribution conductive layers, wherein the outermost redistribution conductive layer is embedded in the backside dielectric layer, and the backside dielectric layer includes a recess covered by the outermost redistribution conductive layer. In some embodiments, the recess includes a ring-shaped recess, the backside dielectric layer includes a first dielectric segment and a second dielectric segment covering the first dielectric segment, and the ring-shaped recess is distributed in the second dielectric segment. In some embodiments, the backside dielectric layer includes a first opening distributed in the first dielectric segment and a second opening distributed in the second dielectric segment, the second opening is laterally surrounded by the ring-shaped recess, the outermost redistribution conductive layer is disposed in the first opening and the second opening, and the outermost redistribution conductive layer extends to cover the ring-shaped recess distributed in the second dielectric segment. In some embodiments, the outermost redistribution conductive layer includes a first conductive segment, a second conductive segment and a patterned seed layer disposed between the first conductive segment and the second conductive segment. In some embodiments, the first conductive segment is disposed at an opening defined in the backside dielectric layer, the patterned seed layer covers the first conductive segment, and the second conductive segment covers the patterned seed layer. In some embodiments, the patterned seed layer laterally extends over a portion of the backside dielectric layer to cover the ring-shaped recess. In some embodiments, the patterned seed layer and the second conductive segment are substantially identical in pattern. In some embodiments, a depth of the ring-shaped recess is smaller than a thickness of the backside dielectric layer.

In accordance with some other embodiments of the present disclosure, a package structure including a semiconductor die, a redistribution layer structure and an electronic device is provided. The semiconductor die is laterally encapsulated by an insulating encapsulation. The redistribution layer structure is disposed on the semiconductor die and the insulating encapsulation. The redistribution layer structure includes a backside dielectric layer, inter-dielectric layers and redistribution conductive layers embedded in the backside dielectric layer and the inter-dielectric layers. The electronic device is disposed over the backside dielectric layer and electrically connected to an outermost redistribution conductive layer among the redistribution conductive layers, wherein the outermost redistribution conductive layer is embedded in the backside dielectric layer, and the outermost redistribution conductive layer includes a recess covered by the backside dielectric layer. In some embodiments, the outermost redistribution conductive layer includes a first conductive segment embedded in the backside dielectric layer; a second conductive segment; and a patterned seed layer disposed between the first conductive segment and the second conductive segment. In some embodiments, the second conductive segment and the patterned seed layer are embedded in a bottommost inter-dielectric layer among the inter-dielectric layers. In some embodiments, the patterned seed layer and the second conductive segment laterally extend over a portion of the backside dielectric layer. In some embodiments, the patterned seed layer and the second conductive segment are substantially identical in pattern. In some embodiments, the recess includes a ring-shaped recess, wherein the backside dielectric layer includes a ring-shaped protrusion filling the ring-shaped recess of the outermost redistribution conductive layer. In some embodiments, the outermost redistribution conductive layer includes a patterned seed layer; and a conductive segment covering the patterned seed layer, wherein the patterned seed layer and the conductive segment laterally extend over a portion of the backside dielectric layer. In some embodiments, the patterned seed layer and the conductive segment are substantially identical in pattern.

In accordance with some alternative embodiments of the present disclosure, a package structure including a semiconductor die, a redistribution layer structure and an electronic device is provided. The semiconductor die is laterally encapsulated by an insulating encapsulation. The redistribution layer structure is disposed on the semiconductor die and the insulating encapsulation. The redistribution layer structure includes a backside dielectric layer, inter-dielectric layers and redistribution conductive layers embedded in the backside dielectric layer and the inter-dielectric layers. The electronic device is disposed over the backside dielectric layer and electrically connected to an outermost redistribution conductive layer among the redistribution conductive layers, wherein the outermost redistribution conductive layer is embedded in the backside dielectric layer, and an adhesion enhancement interface is between the outermost redistribution conductive layer and the backside dielectric layer. In some embodiments, the adhesion enhancement interface includes a ring-shaped structure. In some embodiments, the ring-shaped structure includes a ring-shaped protrusion. In some embodiments, the ring-shaped structure includes a ring-shaped recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a semiconductor die laterally encapsulated by an insulating encapsulation, wherein the semiconductor die comprises conductive pillars, a front surface and a back surface opposite to the back surface, and the conductive pillars are disposed on the front surface;
a back-side redistribution layer structure disposed on the back surface of the semiconductor die and a first surface of the insulating encapsulation, the back-side redistribution layer structure comprising a backside dielectric layer, inter-dielectric layers and a redistribution conductive layer embedded in the backside dielectric layer and the inter-dielectric layers, wherein the inter-dielectric layers are between the backside dielectric layer and the semiconductor die, the redistribution conductive layer comprises a surface levelled with a surface of the backside dielectric layer, and the back surface of the semiconductor die is between the surface of the redistribution conductive layer and the front surface of the semiconductor die, and wherein the redistribution conductive layer comprises an indentation part sandwiched between the backside dielectric layer and the inter-dielectric layer; and
an electronic device disposed over the backside dielectric layer and electrically connected to the redistribution conductive layer.

2. The package structure of claim 1, wherein the backside dielectric layer comprises a first dielectric segment and a second dielectric segment covering the first dielectric segment.

3. The package structure of claim 2, wherein the redistribution conductive layer comprises a first conductive segment and a second conductive segment overlying the first conductive segment, the first conductive segment is embedded in the first dielectric segment, the first conductive segment provides the surface levelled with the surface of the backside dielectric layer, the second conductive segment covers a top surface of the second dielectric segment, and the second conductive segment penetrates through the second dielectric segment.

4. The package structure of claim 3, wherein the redistribution conductive layer further comprises a patterned seed layer disposed between the first conductive segment and the second conductive segment.

5. The package structure of claim 4, wherein the first conductive segment interfaces the patterned seed layer with a substantial planar interface.

6. The package structure of claim 4, wherein the patterned seed layer interfaces the backside dielectric layer with a nonplanar interface.

7. The package structure of claim 4, wherein the patterned seed layer and the second conductive segment are substantially identical in pattern.

8. The package structure of claim 1 further comprising a front-side redistribution layer structure disposed on the front surface of the semiconductor die and a second surface of the insulating encapsulation.

9. The package structure of claim 1, wherein the indentation part comprises a ring-shaped indentation part, the inter-dielectric layers comprise a ring-shaped protrusion filling the ring-shaped indentation part of the redistribution conductive layer.

10. A package structure, comprising:
a semiconductor die laterally encapsulated by an insulating encapsulation, wherein the semiconductor die comprises conductive pillars, a front surface and a back surface opposite to the back surface, and the conductive pillars are disposed on the front surface;
a front-side redistribution layer structure in contact with the conductive pillars;
a back-side redistribution layer structure, wherein the front-side redistribution layer structure and the back-side redistribution layer structure are disposed at opposite sides of the semiconductor die, the back-side redistribution layer structure comprising a backside dielectric layer, inter-dielectric layers and a redistribution conductive layer embedded in the backside dielectric layer and the inter-dielectric layers, wherein the inter-dielectric layers are between the backside dielectric layer and the semiconductor die, the redistribution conductive layer comprises a surface leveling with a surface of the backside dielectric layer, and the back surface of the semiconductor die is between the surface of the redistribution conductive layer and the front surface of the semiconductor die; and an electronic device disposed over the backside dielectric layer and electrically connected to the redistribution conductive layer through a solder material in contact with the surface of the redistribution conductive layer, and the redistribution conductive layer comprises an indentation part sandwiched between the backside dielectric layer and the inter-dielectric layers.

11. The package structure of claim 10, wherein the redistribution conductive layer comprises:

a first conductive segment embedded in the backside dielectric layer;

a second conductive segment; and a patterned seed layer disposed between the first conductive segment and the second conductive segment.

12. The package structure of claim 11, wherein the second conductive segment and the patterned seed layer are embedded in a bottommost inter-dielectric layer among the inter-dielectric layers.

13. The package structure of claim 11, wherein the patterned seed layer and the second conductive segment laterally extend over a portion of the backside dielectric layer.

14. The package structure of claim 13, wherein the patterned seed layer and the second conductive segment are substantially identical in pattern.

15. A package structure, comprising:

a semiconductor die laterally encapsulated by an insulating encapsulation, wherein the semiconductor die comprises conductive pillars, a front surface and a back surface opposite to the back surface, and the conductive pillars are disposed on the front surface;

a back-side redistribution layer structure disposed on the back surface of the semiconductor die and a second surface of the insulating encapsulation, the back-side redistribution layer structure comprising a backside dielectric layer, inter-dielectric layers and a redistribution conductive layer embedded in the backside dielectric layer and the inter-dielectric layers, wherein a sidewall of the backside dielectric layer comprises a first tapered part and a protrusion part, the first tapered part extends from a top surface of the backside dielectric layer to the protrusion part, and the protrusion part protrudes toward the redistribution conductive layer with respect to the first tapered part; and an electronic device disposed over the backside dielectric layer and electrically connected to the redistribution conductive layer.

16. The package structure of claim 15, wherein a sidewall of the redistribution conductive layer comprises a second tapered part and a recess part, the second tapered part interfaces the first tapered part, and the recess part interfaces the protrusion part.

17. The package structure of claim 16, wherein the redistribution conductive layer comprises:

a first conductive segment embedded in the backside dielectric layer;

a second conductive segment overlying the first conductive segment; and a patterned seed layer disposed between the first conductive segment and the second conductive segment.

18. The package structure of claim 17, wherein the first conductive segment is spaced apart from the second conductive segment by the patterned seed layer.

19. The package structure of claim 15, wherein the redistribution conductive layer comprises:

a patterned seed layer; and a conductive segment covering the patterned seed layer, wherein the patterned seed layer and the conductive segment laterally extend over a portion of the backside dielectric layer.

20. The package structure of claim 19, wherein the patterned seed layer and the conductive segment are substantially identical in pattern.

* * * * *